(12) United States Patent
Mizuno et al.

(10) Patent No.: US 7,813,156 B2
(45) Date of Patent: *Oct. 12, 2010

(54) SEMICONDUCTOR DEVICE

(75) Inventors: Hiroyuki Mizuno, Musashino (JP); Takeshi Sakata, Hino (JP); Nobuhiro Oodaira, Akishima (JP); Takao Watanabe, Fuchu (JP); Yusuke Kanno, Kodaira (JP)

(73) Assignees: Renesas Technology Corp., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/242,164

(22) Filed: Sep. 30, 2008

(65) Prior Publication Data

US 2009/0027984 A1    Jan. 29, 2009

Related U.S. Application Data

(63) Continuation of application No. 11/761,642, filed on Jun. 12, 2007, now Pat. No. 7,436,722, which is a continuation of application No. 11/363,085, filed on Feb. 28, 2006, now Pat. No. 7,242,627, which is a continuation of application No. 11/118,338, filed on May 2, 2005, now Pat. No. 7,126,868, which is a continuation of application No. 10/751,402, filed on Jan. 6, 2004, now Pat. No. 6,990,002, which is a continuation of application No. 10/149,221, filed as application No. PCT/JP00/00616 on Feb. 4, 2000, now Pat. No. 6,687,175.

(51) Int. Cl.
*G11C 5/06* (2006.01)

(52) U.S. Cl. .......................... 365/63; 365/203; 365/206

(58) Field of Classification Search .................... 365/63, 365/203, 206

See application file for complete search history.

(56) References Cited

U.S. PATENT DOCUMENTS 4,777,625 A    10/1988  Sakui et al.

| 4,973,864 A | 11/1990 | Nogami |
| 5,262,999 A | 11/1993 | Etoh et al. |
| 5,274,598 A | 12/1993 | Fujii et al. |
| 5,315,555 A | 5/1994 | Choi |
| 5,386,394 A | 1/1995 | Kawahara et al. |

(Continued)

FOREIGN PATENT DOCUMENTS

JP    64-1195 A    1/1989

(Continued)

OTHER PUBLICATIONS

Lee, K-C., et al., "Low Voltage High Speed Circuit Designs for Giga-bit DRAMs", *1996 Symposium on VLSI Circuits Digest of Technical Papers*, 1996, pp. 104-105.
Itoh, Kiyoo, *VLSI Memory Design*, Baifukan, 1994, pp. 162-163.

*Primary Examiner*—Son Dinh
(74) *Attorney, Agent, or Firm*—Miles & Stockbridge P.C.

(57) ABSTRACT

The present invention provides a sense circuit for DRAM memory cell to cover the events that a sense time becomes remarkably longer when a power source voltage is lowered, a sense time under the low voltage condition becomes shorter when temperature rises and a sense time changes to a large extent for fluctuation of processes. The present invention provides the following typical effects. A switch means is provided between the bit line BL and local bit line LBL connected to the memory cells for isolation and coupling of these bit lines. The bit line BL is precharged to the voltage of VDL/2, while the local bit line LBL is precharged to the voltage of VDL. The VDL is the maximum amplitude voltage of the bit line BL. A sense amplifier SA comprises a first circuit including a differential MOS pair having the gate connected to the bit line BL and a second circuit connected to the local bit line LBL for full amplitude amplification and for holding the data. When the bit line BL and local bit line LBL are capacitance-coupled via a capacitor, it is recommended to use a latch type sense amplifier SA connected to bit line LBL.

11 Claims, 28 Drawing Sheets

U.S. PATENT DOCUMENTS

| | | |
|---|---|---|
| 5,408,438 A | 4/1995 | Tanaka et al. |
| 5,436,864 A | 7/1995 | Koh et al. |
| 5,457,657 A | 10/1995 | Suh |
| 5,495,440 A | 2/1996 | Asakura |
| 5,525,918 A | 6/1996 | Reddy |
| 5,526,313 A | 6/1996 | Etoh et al. |
| 5,854,562 A | 12/1998 | Toyoshima et al. |
| 5,886,943 A * | 3/1999 | Sekiguchi et al. ...... 365/230.03 |
| 5,917,745 A | 6/1999 | Fujii |
| 5,978,255 A | 11/1999 | Naritake |
| 5,995,403 A | 11/1999 | Naritake |
| 6,104,653 A | 8/2000 | Proebsting |
| 6,147,514 A | 11/2000 | Shiratake |
| 6,201,728 B1 | 3/2001 | Narui et al. |
| 6,292,015 B1 | 9/2001 | Ooishi et al. |
| 6,333,884 B1 | 12/2001 | Kato et al. |
| 6,452,851 B1 | 9/2002 | Endo et al. |

FOREIGN PATENT DOCUMENTS

| | | |
|---|---|---|
| JP | 03-029180 A | 2/1991 |
| JP | 03-095794 A | 4/1991 |
| JP | 04-370596 A | 12/1992 |
| JP | 5-109272 A | 4/1993 |
| JP | 07-153270 A | 6/1995 |
| JP | 08-249889 A | 9/1996 |
| JP | 11-176163 A | 7/1999 |

* cited by examiner (A)

(B)

SEMICONDUCTOR DEVICE

CROSS-REFERENCE TO RELATED APPLICATION

This application is a continuation of application Ser. No. 11/761,642 filed Jun. 12, 2007, now U.S. Pat. No. 7,436,722 which is a continuation of application Ser. No. 11/363,085 filed Feb. 28, 2006 (now U.S. Pat. No. 7,242,627 issued Jul. 10, 2007), which is a continuation of application Ser. No. 11/118,338 filed May 2, 2005 (now U.S. Pat. No. 7,126,868 issued Oct. 24, 2006), which is a continuation of application Ser. No. 10/751,402 filed Jan. 6, 2004 (now U.S. Pat. No. 6,990,002 issued Jan. 24, 2006), which is a continuation of application Ser. No. 10/149,221 filed Jun. 10, 2002 (now U.S. Pat. No. 6,687,175 issued Feb. 3, 2004), which is a 371 of International Application No. PCT/JP00/00616 filed Feb. 4, 2000.

TECHNICAL FIELD

The present invention relates to a semiconductor device and particularly to a semiconductor integrated circuit device having excellent low voltage operation characteristics.

BACKGROUND ART

In this specification, reference is made to the following cited references identified with the reference numbers.
[Reference 1] "VLSI Memory Design" Kiyoo Itoh, p 162;
[Reference 2] "Japanese Patent Laid-open No. Hei 2-24898 (corresponding U.S. Pat. No. 4,973,864);
[Reference 3] "Japanese Patent Laid-open No Hei 10-3971 (corresponding U.S. Pat. No. 5,854,562);
[Reference 4] "1996 Symposium on VLSI Circuits Digests of Technical Papers, pp. 104-105;

FIG. 26.1 of the [Reference 1] is a sensing system circuit diagram of the standard DRAM (Dynamic Random Access Memory) This diagram is a so-called shared sense-amplifier structure (having the structure where one sense amplifier line is used in common by the right and left memory mats). FIG. 18 shows a circuit diagram where this structure is omitted. A C100 and a M100 form a memory cell wherein the M100 indicates a charge transfer NMOS transistor, while VPL indicates a plate voltage. BL[n], /BL[n] are bit lines, WL[m] is word line, and a memory cell is disposed at an adequate intersection to form a memory array MA100. M101, M102, M103 are NMOS transistors and VBM is a power source voltage equal to a half of the data line voltage VDL. These elements are precharge circuit 101 of the so-called half VDD precharge system for precharging the bit line to the VBM potential by turning ON the M103 from the M101. M200, M201 are PMOS transistors, while M202, M203 are NMOS transistors, forming a CMOS latch type sense amplifier 201. Moreover, M109 and M110 are NMOS transistors to form a Y switch 103a to selectively connect the bit lines BL[n], /BL[n] to the global bit lines GBL[p], /GBL[p] by turning ON the M109 and M110.

FIG. 19 shows waveforms for the read operation of this memory. Here, an array voltage VDL is set to a voltage which is equal to the power source voltage VDD assumed as 1.0V. Moreover, the power source voltage VBM is assumed as 0.5V which is equal to a half of such power source voltage and a setup voltage of the word line is assumed as 2.5V.

A precharge signal EQ is negated at the time T0 and a word line WL[m] is asserted at the time T1. Thereby, the MOS transistor M100 in the memory cell selected by such word line turns ON to share the charges accumulated in the capacitor C100 within the memory cell and a parasitic capacitance added to the bit lines BL[n], /BL[n] in order to generate a potential difference Vs for reflecting information within the memory cell on the bit lines BL[n], /BL[n].

Since the sense amplifier activate signals CSP and CSN are respectively driven to 1.0V and 0V, the bit line potentials BL[n], /BL[n] are amplified up to 1.0V and 0V. In this figure, since a YS[k] is asserted, a Y switch is turned ON and the global bit lines GBL[p], /GBL[p] are also amplified simultaneously when the bit lines BL[n], /BL[n] are amplified.

The signal /BL[n] which is given the slash sign "/" before BL[n] among the signals explained above depends on the generally used expression method and this signal /BL[n] means a complementary signal of BL[n]. Moreover, a bracket [ ] is also the generally used expression method and the signal BL[n], for example, means the typical expression of signals of bus structure consisting of one or more signal lines such as BL[0], BL[1], BL[2]. This expression method is used in this specification.

FIG. 20(A) shows a result of simulation of sensing rate (tSENSE) of the sensing system circuit of DRAM of FIG. 8 conducted by the inventors of the present invention. The sensing rate (tSENSE) is defined, as shown in FIG. 20(B), as the time required until a potential difference of the bit lines BL, /BL is amplified up to the 60% of the power source voltage VDD from activation of the sensing amplifier. Temperature is assumed as two kinds of temperatures of −40° C. and 125° C. in terms of the junction temperature Tj. This analysis by the inventors of the present invention has proved as follows.

(A1) The sense time (tSENSE) is remarkably delayed as the power source voltage is lowered.

(A2) When the power source voltage is equal to about 1.2V or less, the sense time in the higher temperature is further than that in the lower temperature. It is because a drive current of the sensing amplifier is mainly governed with a diffusion current, in place of a drift current, among the drain current of the MOS transistor. In general, the diffusion current very sensitively changes for temperature and a threshold value of MOS transistor. Therefore, when a sense amplifier is used in the area where the diffusion current governs the operation in place of the drift current, a sensing time changes to a large extent for fluctuation of manufacturing process of LSI and fluctuation of operation environment. This event may grow up to a problem that an yield rate of an LSI circuit is lowered. As a result, cost of LSI using DRAM of the circuit of such structure rises.

Moreover, FIG. 20(C) shows dependence of a delay time of a CMOS inverter on a power source voltage as an example of a delay time characteristic (tDLAY) of an ordinary CMOS logic circuit. Temperature is assumed as two kinds of temperatures of −40° C. and 125° C. in terms of junction temperature Tj as in the case of FIG. 20(A). This analysis by the inventors of the present invention has proved as follows.

(B1) Deterioration in the operation rate when the power source voltage is lowered is remarkably smaller than that of the sensing system of the existing DRAM shown in FIG. 18.

(B2) The temperature characteristic in the lower voltage condition is different in the CMOS inverter and the sensing system of the existing DRAM shown in FIG. 18.

From this fact, it can be understood that the DRAM circuit including the existing sensing system shown in FIG. 18 and the logic circuit having the delay characteristic shown in FIG. 20(C) are not matched with each other through the low voltage characteristics thereof. Here, matching of a plurality of circuits means that dependence of delay characteristic on the power source voltage and temperature is similar. For example, when the power source voltage is set to a lower value, the operation rate of all circuits is delayed in the similar degree and when the temperature is lowered, the operation rate of all circuits is also delayed in the similar degree.

When the DRAM including the existing sensing system as shown in FIG. 18 and a logic circuit which are not matched are disposed simultaneously on the same LSI, the operation rate during a low voltage operation of the logic LSI including such DRAM is governed with the characteristic that operation rate of the DRAM is rather low under the lower temperature. For example, the operation rate of the LSI as a whole is governed with the racing. Moreover, when the logic LSI including such DRAM is used in a plurality of operation modes where the power source voltage and the operating frequency vary, the operating frequency in the low voltage operation mode is extremely delayed because the DRAM is included.

Therefore, it is an object of the present invention to provide a sense amplifier which stably operates even under the low voltage condition.

DISCLOSURE OF INVENTION

A typical structure of the present invention is as follows. Namely, a semiconductor device comprises a word line (WL), a first bit line pair (BL, /BL), a memory cell (MC) provided at an intersection of the word line and the first bit line pair, a second bit line pair (LBL, /LBL), switch circuits (ISO_SW_T, ISO_SW_B) for coupling the first bit line pair and second bit line pair, a sense amplifier including a first circuit (PSA) connected to the first bit line pair and a second circuit (MSA) connected to the second bit line pair, a first precharge circuit (PC1) for precharging the first bit line pair to a first precharge potential and a second precharge circuit (PC2) for precharging the second bit line pair to a second precharge potential, wherein the second circuit is a circuit for amplifying one of the first bit line pair and one of second bit line pair to a first potential (VSS) receiving a storage signal of the memory cell and the other pair to a second potential (VDL), the first precharge potential is a voltage (VBM) between the first potential and the second potential and the second precharge potential is equal to the second potential.

Moreover, according to the other aspect of the present invention, a semiconductor device comprises a word line (WL), a first bit line pair (BL, /BL), a memory cell (MC) provided at an intersection of the word line and first bit line pair, a capacitor pair including a first capacitor (C250) having a first electrode connected to one of the first bit line pair and a second electrode connected to one of the second bit line pair and a second capacitor (C251) having a third electrode connected to the other of the first bit line pair and a fourth electrode connected to the other of the second bit line pair, a switch circuit including a first switch (M206) for connecting one of the first bit line pair and one of the second bit line pair and a second switch (M207) for connecting the other of the first bit line pair and the other of the second bit line pair, a sense amplifier (SA) connected to the second bit line pair, a first precharge circuit (PC1) for precharging the first bit line pair to a first precharge potential and a second precharge circuit (PC2) for precharging the second bit line pair to a second precharge potential.

BEST MODE FOR CARRYING OUT THE INVENTION

The preferred embodiments of the present invention will be explained in detail with reference to the accompanying drawings. Circuit elements forming each function block of the preferred embodiments are formed, although not particularly limited, on only one semiconductor substrate made of single crystal silicon or the like with the well known technology to form CMOSs (complementary MOS transistors). The P-type MOS transistor (MOSFET) can be discriminated by giving a sign ○ to the gate thereof from an N-type MOS transistor (MOSFET).

Embodiment 1

Figure 1:
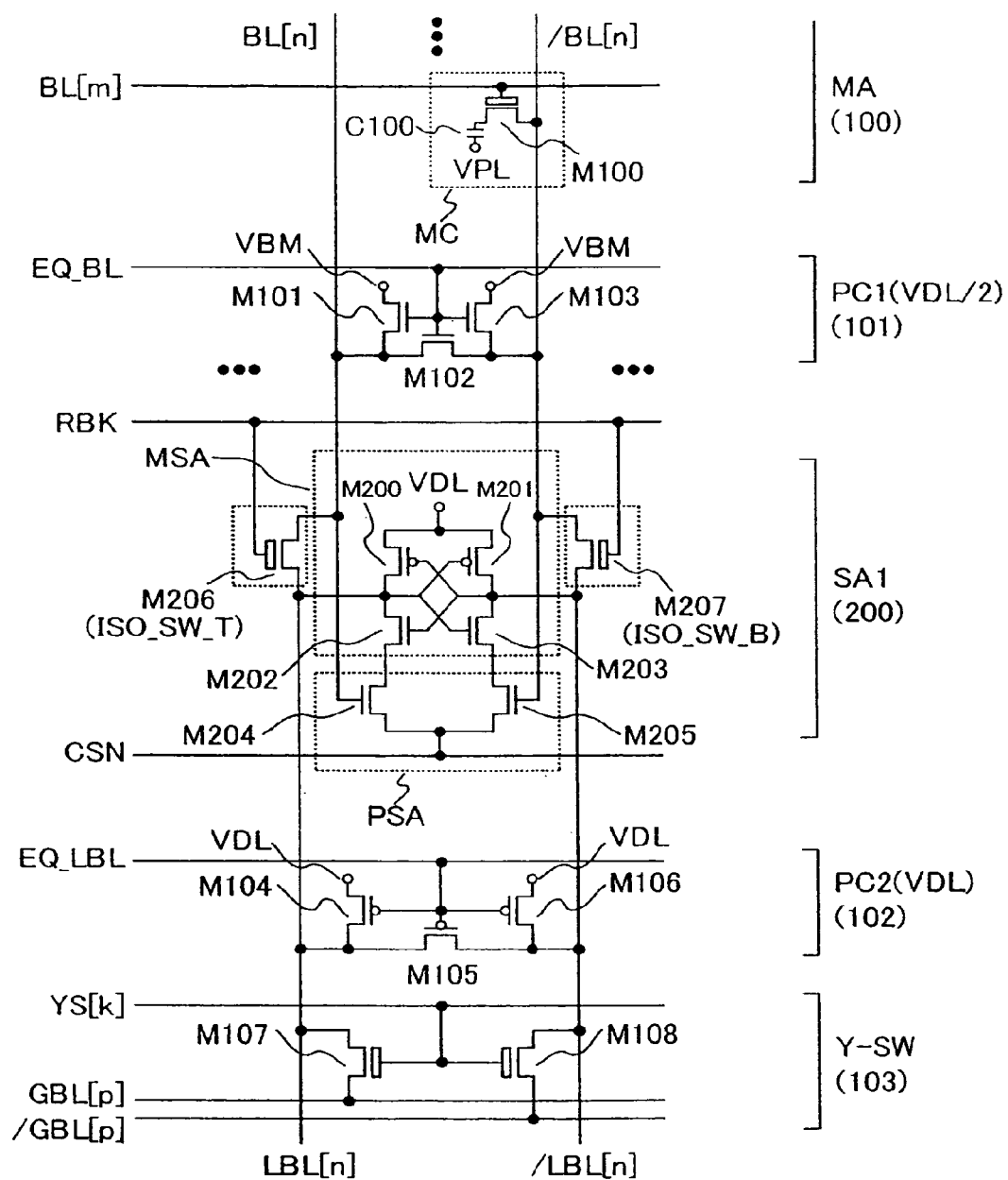
FIG. 1 is a diagram showing an embodiment of a sensing system circuit of the present invention.

FIG. 1 shows an embodiment of a typical sensing system circuit of the present invention. C100 and M100 form a memory cell (MC). The C100 is a capacitor for storing information within the memory cell, M100 is a charge transfer NMOS transistor and VPL is a plate voltage. BL[n] and /BL[n] are bit lines, WL[m] is a word line and a memory cell is disposed at the adequate intersection to form a memory array 100. Here, the embodiment based on the folded bit line structure is shown but a open bit line structure may also be introduced. In this figure, M107 and M108 are NMOS transistors to form a Y switch Y-SW, while the local bit lines LBL[n], /LBL[n] can be selectively connected to the global bit lines GBL[p], /GBL[p] by turning ON the M107 and M108.

A sense amplifier SA1 employed in this invention has the following characteristics. Namely, the sense amplifier SA1 includes a pre-sense amplifier PSA connected to the bit line pair BL[n], /BL[n] (these can also be abbreviated as "BL") and local bit line pair LBL[n], /LBL[n] (these can also be abbreviated as "LBL"). Moreover, switch circuits (ISO_SW_T, ISO_SW_B) for controlling connection and isolation of the BL and LBL are also provided. The PSA includes a N-type MOSFET pair (M204 and M205) with the gate thereof connected to the BL and the source thereof connected in common and this N-type MOSFET pair operates as the differential MOSFET pair for receiving a signal at the gate. Moreover, a main sense amplifier MSA is a circuit including the CMOS latch type sense amplifier as the basic structure. In the MSA, the P-type MOSFET pair M200 and M201 assures that the gate and drain thereof are cross-connected and the sources are connected in common. Moreover, the N-type MOSFET pair M202 and M203 assures that the gate and drain thereof are cross-connected and the sources are connected to the drains of the N-type MOSFET pair of the PSA.

Figure 9:
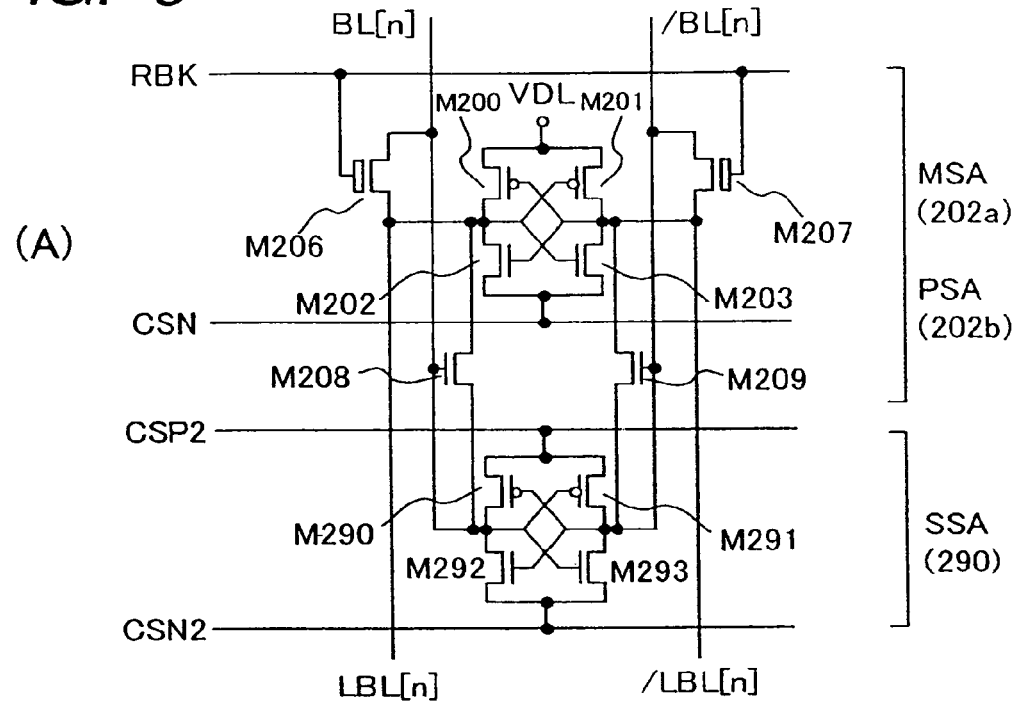
FIG. 9 is a diagram showing the other embodiment of a sense amplifier of the present invention.
Figure 9:
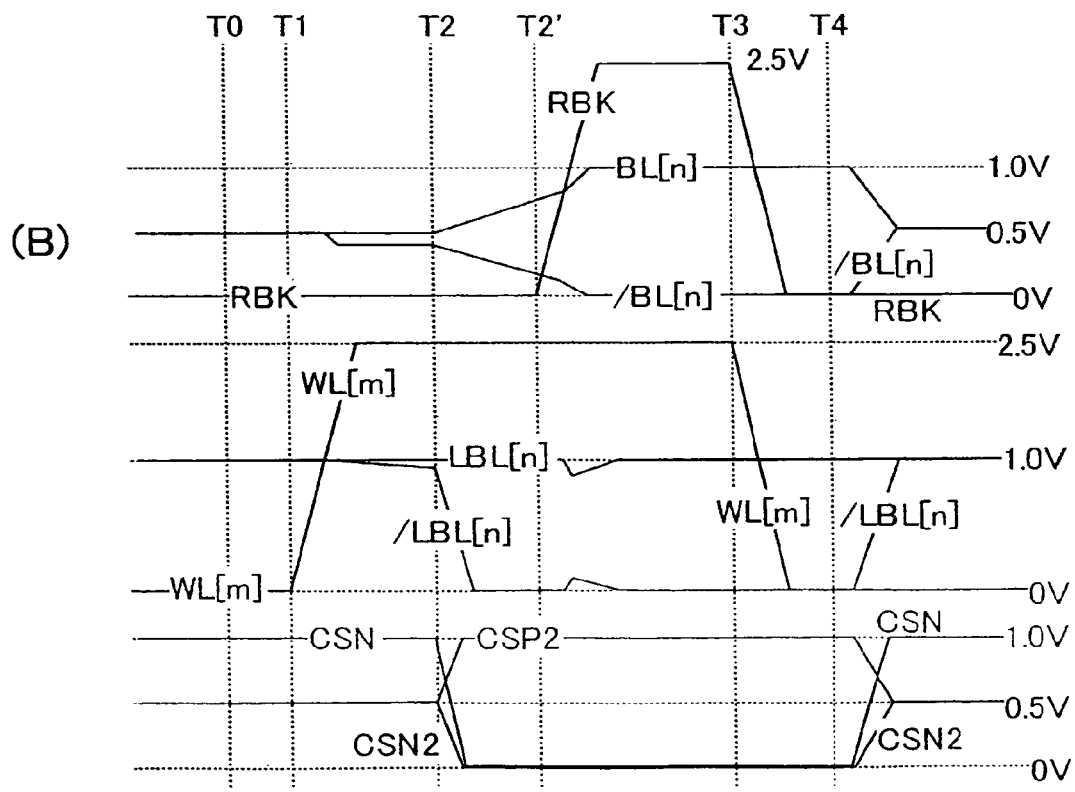

FIG. 9 of the [Reference 2] shows a sense amplifier including the PSA and MSA explained above when attention is paid to the format of circuit. Moreover, FIG. 16 of the [Reference 2] shows a circuit operation. However, the sense amplifier of the [Reference 2] relates to the SRAM. Namely, this reference does not suggest application to the DRAM of the present invention and therefore any consideration is never taken for the switch circuits (ISO_SW_T. ISO_SW.B) explained below.

The second characteristic of the present invention is that the switch circuits (ISO_SW_T ISO_SW_B) for controlling connection and isolation of the BL and LBL are provided corresponding to difference of precharge potentials of the BL and LBL. M206 and M207 are NMOS transistors. Re-write operation can be realized by electrically connecting the BL and LBL with this switch circuit and then transferring the data amplified with the MSA to the BL from the LBL.

The third characteristic of the present invention is that the BL is precharged to VDL/2, while the LBL to VDL. The M101, M102, M103 are NMOS transistors and VBM is a power source voltage equal to a half voltage of the data line voltage VDL. These elements form a so-called precharge circuit 101 of the half VDD precharge system for precharging the bit lines BL[n], /BL[n] (first bit line pair) to the VBM potential (first precharge voltage) by turning ON the M103 from the M101. On the other hand, M104, M105 and M106 are transistors and these elements form a so-called precharge circuit 102 of the VDD precharge system for precharging the LBL (second bit line pair) to the VDL potential (second precharge voltage) by turning ON these MOS transistors.

Figure 2:
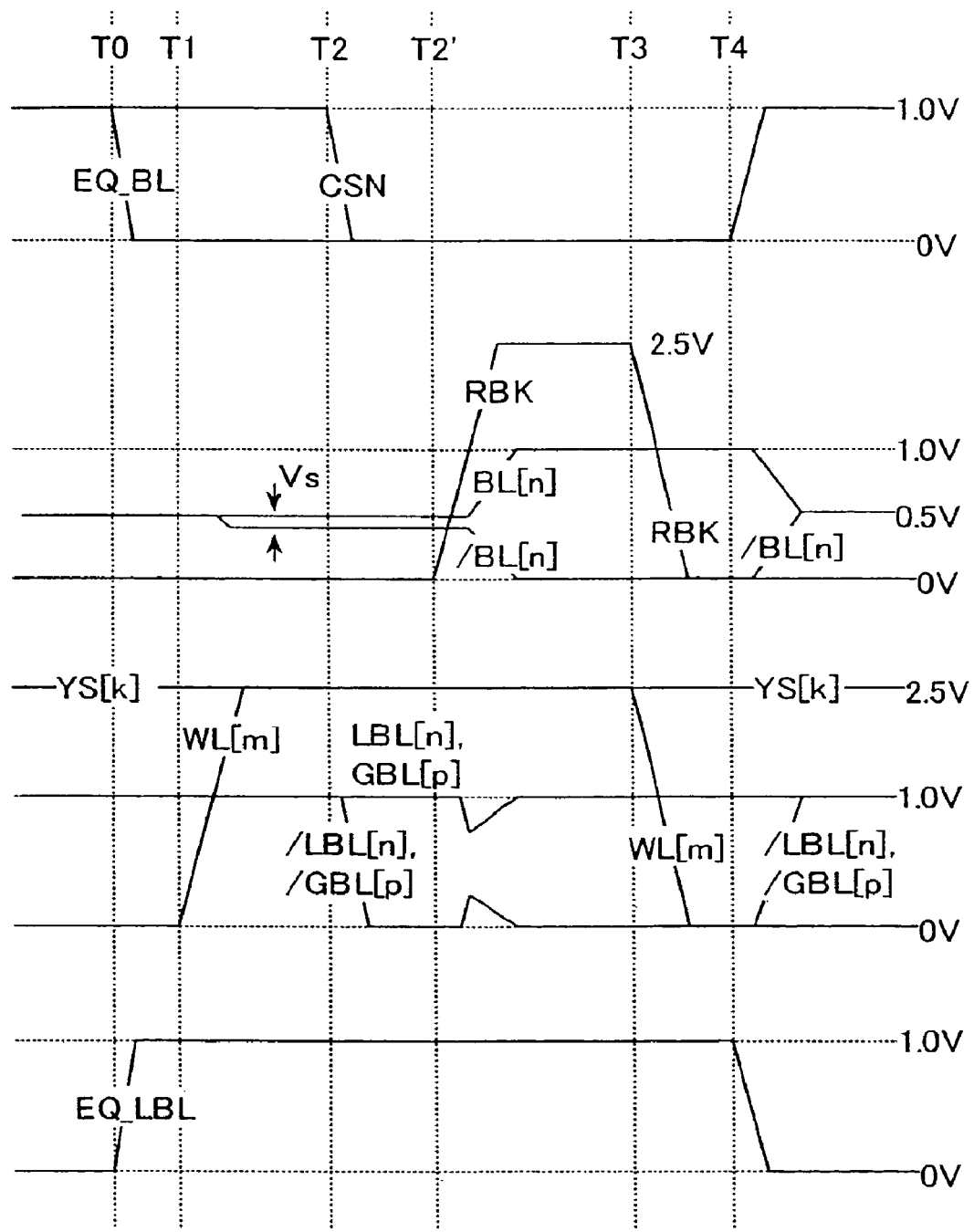
FIG. 2 is a diagram showing an embodiment of the read operation of FIG. 1.

FIG. 2 shows an example of the read operation waveforms of the memory of FIG. 1. Here, an array voltage VDL is set to a voltage which is equal to the power source voltage VDD of chip and is assumed as 1.0V for simplified explanation Moreover, the VBM is assumed as a voltage of 0.5V which is equal to a half of the VDL, while the setup voltage of the word line is assumed as 2.5V.

The precharge signals EQ_BL and EQ_LBL are negated at the time T0 and the word line WL[m] is asserted at the time T1. Therefore, the transfer MOS transistor M100 in the memory cell selected with such word line turns ON, sharing the charges accumulated within the capacitor C100 in the memory cell and the parasitic capacitance added to the bit lines BL[n], /BL[n] and thereby a potential difference Vs reflecting information within the memory cell is generated between the bit lines BL[n] and /BL[n].

A sense amplifier is activated at the time T2 by driving a sense amplifier activate signal CSN to 0V, potential differences of the bit lines BL[n] and /BL[n] are amplified up to 1.0V and 0V and these potential differences are outputted to the local bit lines LBL[n] and /LBL[n]. Since YS[k] is asserted in this figure, the Y switch is turned ON and the global bit lines GBL[p], /GBL[p] are also amplified simultaneously with amplification of the bit lines BL[n], /BL[n].

Moreover, a wrote back signal RBK is asserted at the time T2' to execute the re-write to the memory cell by transferring the amplified signals of the local bit lines LBL[n], /LBL[n] to the bit lines BL[n], /BL[n].

The write back signal RBK and word line WL[m] are negated at the time T3, the precharge signals EQ_BL and EQ_LBL are asserted at the time T4, thereby the bit lines BL[n] and /BL[n] are precharged to 0.5V, while the local bit lines LBL[n], /LBL[n] are precharged to 1.0V.

Figure 3:
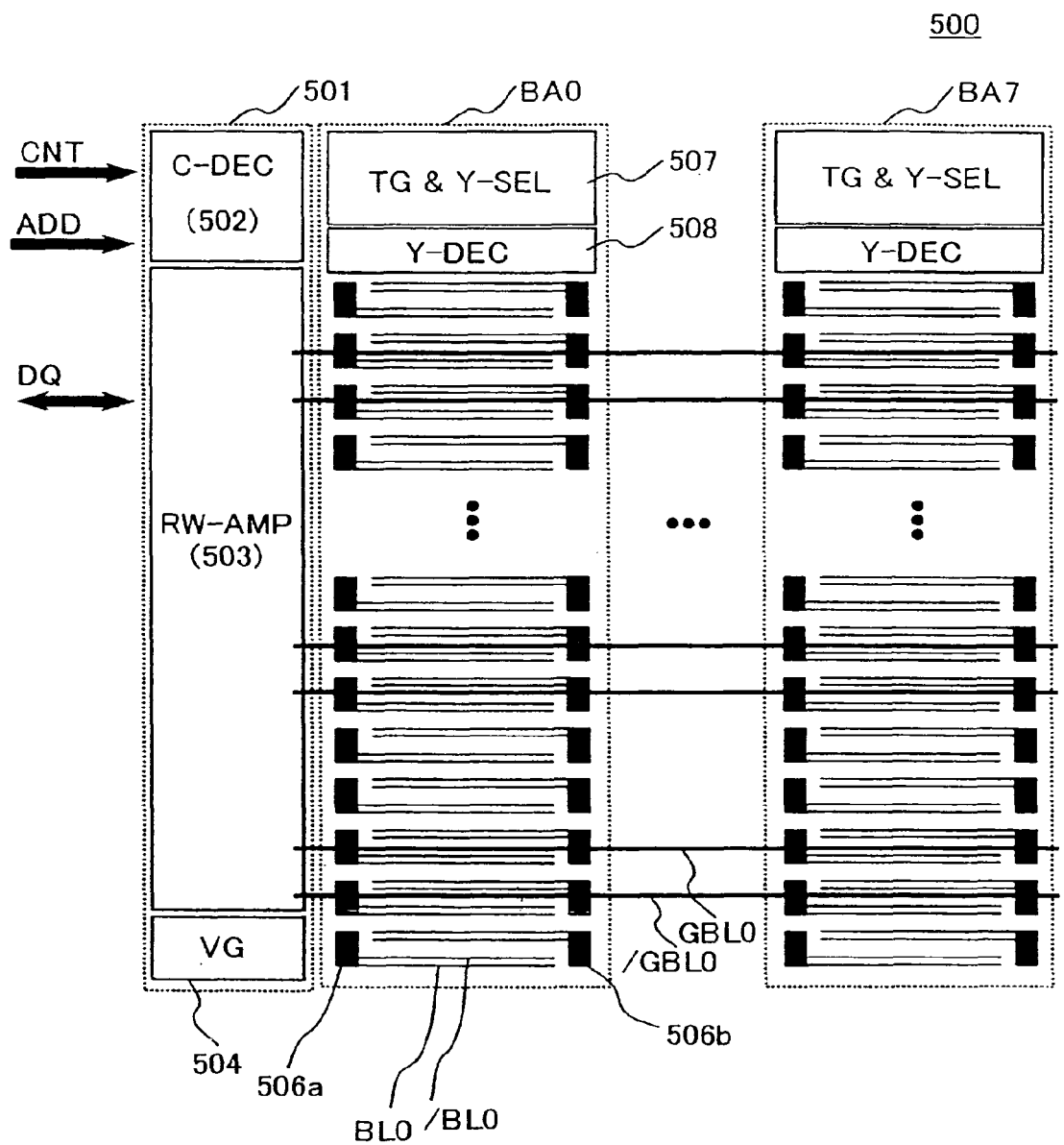
FIG. 3 is a diagram showing a DRAM macro including logics using the sensing system circuit of the present invention.

FIG. 3 shows an embodiment of the DRAM macro using the sensing system circuit of FIG. 1. Numeral 500 designates a DRAM macro. Numeral 501 designates an indirect peripheral circuit consisting of a command decoder 502, a read/write amplifier 503 and a power source circuit 504. Moreover, BA0 to BA7 are memory banks. Each bank is composed of a timing control circuit TG, a column selection circuit Y-DEC, a row decoder X-DEC and a plurality of sense amplifiers 506a, 506b. The sensing system circuit shown in FIG. 1 corresponds to 506a or 506b of FIG. 3 and is disposed in each bank in the manner that the two units are provided opposed with each other. A control signal of the word line WL[m] or the like of FIG. 1 is controlled with the row decoder, timing control circuit and column selection circuit or the like. The GBL0, /GBL0 form a pair of the global bit lines and are laid in parallel to the bit lines BL0, /BL0 and the eight sense amplifiers of the sensing system circuit indicated with 506a, 506b of each bank are connected to a pair of global bit lines GBL (it means that a degeneration degree is 8). The GBL is provided crossing the memory bank and is connected to a block 503 including a read/write amplifier RW-AMP provided corresponding to the memory bank. The read/write amplifier RW-AMP is connected, via a selected as required or in direct, to the external input/output data signal line DQ. The control signal CNT and address signal ADD of the DRAM macro are inputted to a command decoder C-DEC and this C-DEC sends a control signal to TG or the like to execute the predetermined read or write operation.

In the embodiment of FIG. 3, it is a characteristic that since an independent sensing system circuit is formed for each bank and moreover a timing control circuit 507 is provided within each bank, each bank can be operated independently with the control from the command decoder 502. The throughput of the DRAM macro can be enhanced with the so-called interleave system by the independent operation of each bank.

Figure 4:
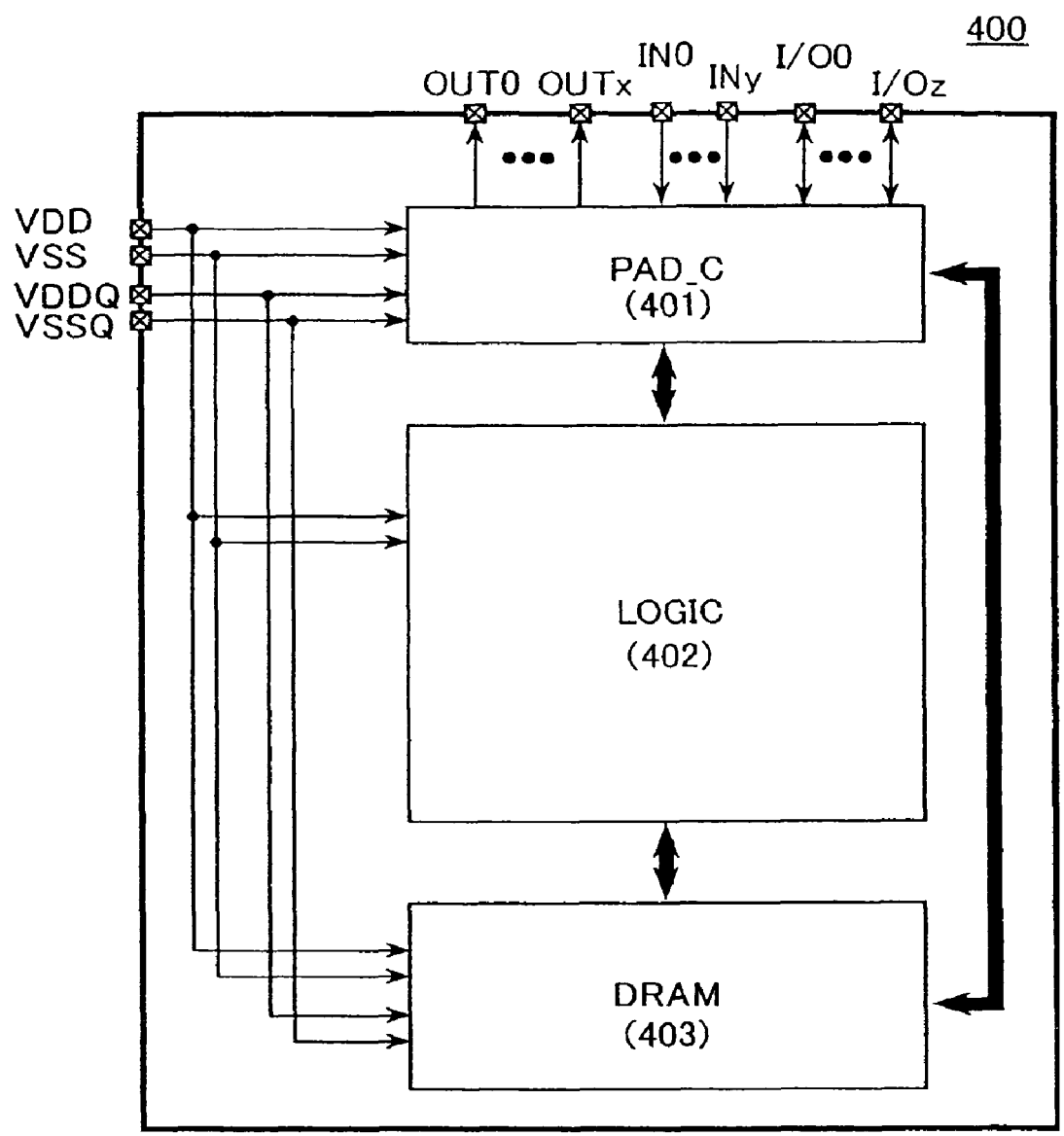
FIG. 4 is a diagram showing an embodiment of a system LSI using the DRAM including logics of the present invention.

FIG. 4 shows the entire part of a logic LSI (400) including the DRAM comprising the DRAM macro 500 shown in FIG. 3. VDD and VSS indicate the core power source and its ground, while VDDQ and VSSQ indicate the I/O power source and its ground. For example, the core power source voltage is 1.0V and the I/O power source voltage is 3.3V. OUT0 to OUTx indicate the output signals, while IN0 to INy are input signals and I/00 to I/0z are input/output signals, respectively. Moreover, 401 designates an I/O circuit for interface of an internal signal of the chip and an external signal of the chip. Numeral 402 designates a logic circuit formed of an inverter, NAND gate or the like and 403 designates the DRAM macro shown in FIG. 3. As an example of 402, a microprocessor (CPU) or DSP or SRAM or the like may be listed although not particularly restricted.

Figure 20:
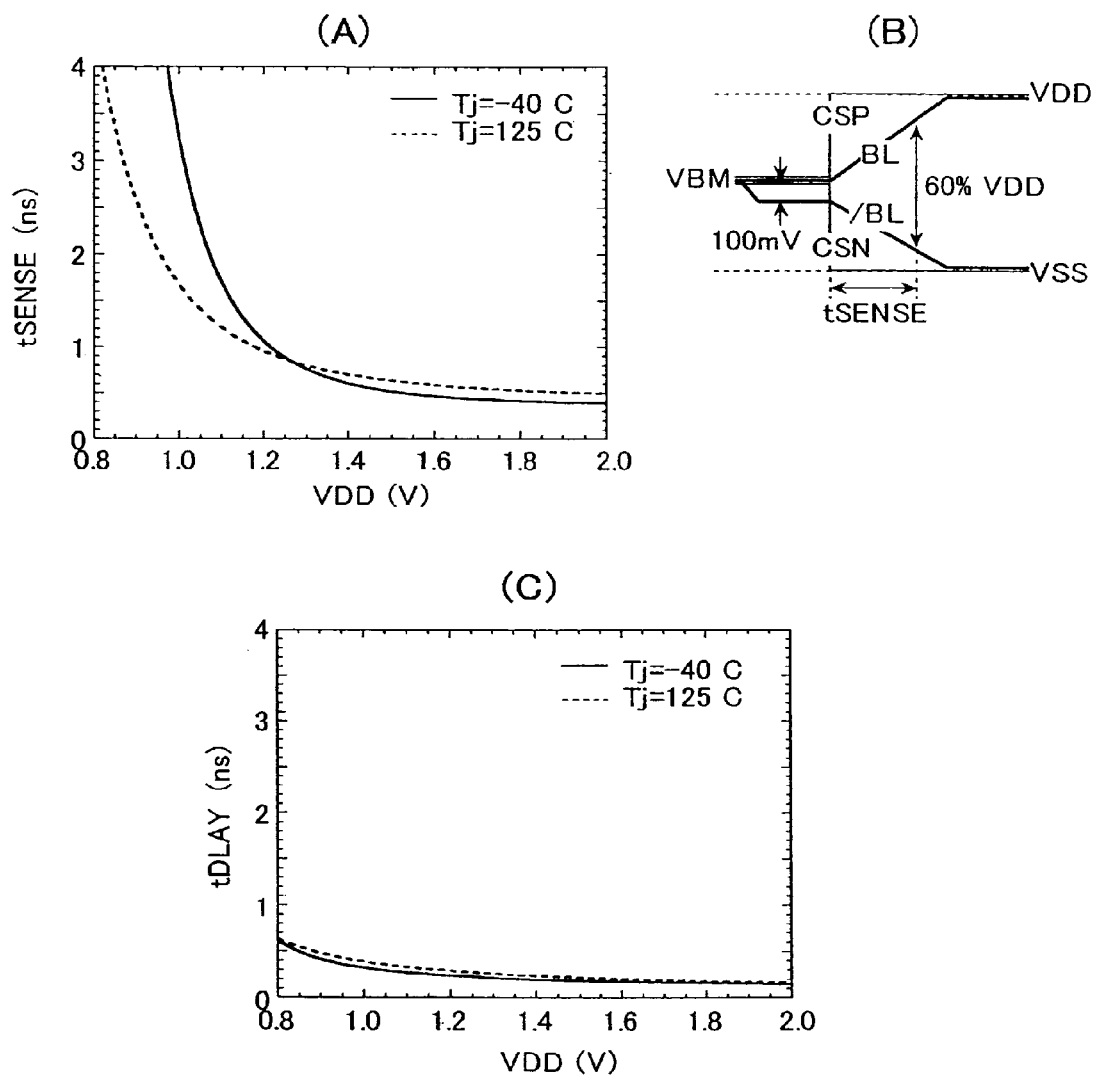
FIG. 20 is a diagram showing the results of simulations by the inventors of the present invention of the low voltage characteristics of the sensing system circuit of FIG. 18 and the low voltage characteristics of the CMOS inverter.
Figure 21:
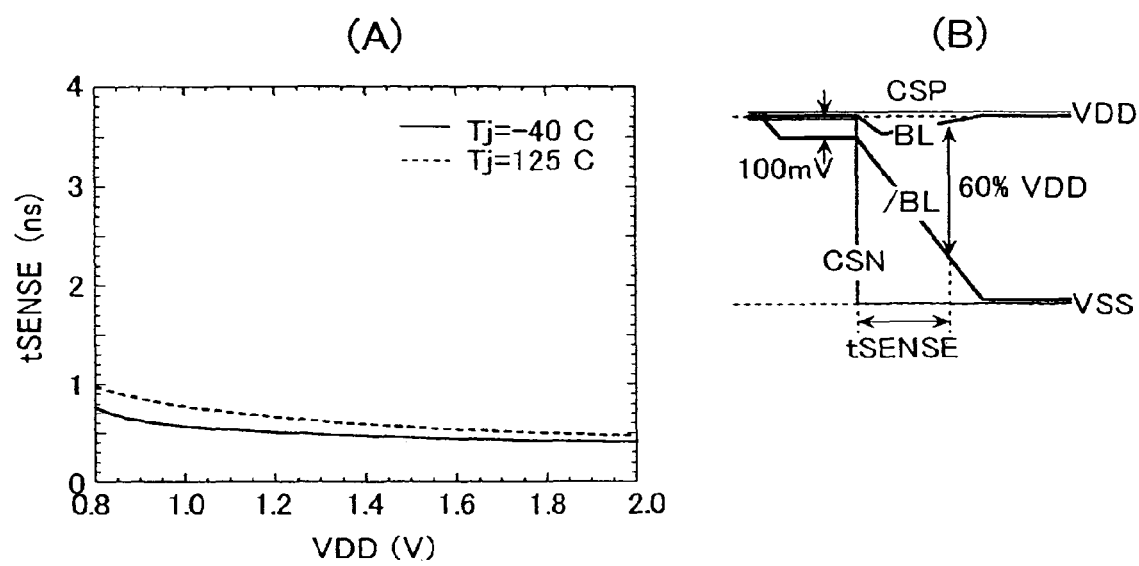
FIG. 21 is a diagram showing the results of simulations by the inventors of the present invention of the low voltage characteristics when the sensing system circuit of FIG. 18 is operated in the VDD precharge system.

FIG. 21 shows a result of simulation conducted for evaluating the characteristics of the sensing system circuit of the present invention shown in FIG. 1. This simulation result means a result of calculation when the bit lines BL[n] /BL[n] are precharged to the VDD in the sensing circuit of the DRAM shown in FIG. 18. A circuit configuration is same as that of FIG. 20(A) except for the precharge system. The simulation result is also the same as that of FIG. 19, except for the drive method of the sense amplifier activate signal that the CSP is fixed to the VDD potential and the CSN is driven to the VSS potential from the VDD potential. The inventors of the present invention has proved as follows from the analysis explained above.

(C1) The sense time (tSENSE) is delayed as the power source voltage is lowered but a degree of such delay is rather gradual in comparison with FIG. 20(A) and is well matched with the characteristics of the CMOS inverter (FIG. 20(C)).

(C2) In the range where at least the power source voltage is equal to or higher than 0.8V, the sense time is rather fast than that when the temperature is lower. It is because a drive current of the sense amplifier is mainly governed with a drift current, in place of a diffusion current, among the drain current of the MOS transistor and it is well matched with the characteristics of the CMOS inverter (FIG. 20(C)).

As explained above, the low voltage operation characteristic of the sensing system circuit of the VDD precharge system is more excellent than that of the half VDD precharge system to a remarkable extent and it can be understood that the DRAM sense circuit of the VDD precharge system is well matched with the CMOS inverter. Only a result of the VDD precharge system is indicated here to simplify the explanation, but the VDD precharge is executed before the drive of the sense amplifier in regard to the amplification of the local bit lines even in the sensing system circuit of the present invention shown in FIG. 1. Namely, these precharge systems are essentially identical and the characteristics shown in FIG. 21 and explained above can also be obtained.

Moreover, the VDD precharge system has a problem that a particular cell such as a dummy cell or the like is required for generation of the reference voltage. However, in the present invention, such dummy cell for the reference voltage has been eliminated by isolating the bit lines BL[n], /BL[n] connected to the memory cell and the local bit lines LBL[n], /LBL[n] for the DC element, using the half VDD precharge system for the bit lines BL[n], /BL[n] and using the VDD precharge system for the local bit lines LBL[n], /LBL[n].

As explained above, the sensing system circuit of the present invention shown in FIG. 1 is characterized as follows.

(D1) A sense time in the lower temperature condition is faster than that in the higher temperature condition even when a voltage is low.

(D2) Deterioration in a sense rate under the low voltage condition is controlled to the same degree as the deterioration of delay time of the CMOS inverter shown in FIG. 20(B).

The characteristic of the item (D1) is attained because a drive current of the sense amplifier in the present invention is mainly governed with a drift current, in place of a diffusion current, among the drain current of MOS transistor. In general, change of a diffusion current is very sensible to temperature and threshold value of MOS transistor. Therefore, when a sense amplifier is used in the area where is mainly governed with a diffusion current in place of a drift current like the sensing system circuit shown in FIG. 18, a sense time changes largely for fluctuation in manufacturing processes of LSI and fluctuation in operation environment of LSI. This change is developed up to a problem that an yield rate of the LSI circuit is lowered. As a result, a manufacturing cost of LSI using the DRAM of the circuit configuration explained above rises. Accordingly, it can be said that the sensing system circuit of the present invention is resistive to fluctuation in manufacturing processes of LSI and fluctuation in operation environment of LSI Moreover, the sensing system circuit has a circuit configuration having a higher yield rate.

Moreover, with the characteristics of the items (D1), (D2), the DRAM macro 403 has the characteristic which is well matched with the low voltage characteristic of the logic circuit 402 of FIG. 2. Therefore, it can no longer be said that any one of above elements will mainly control the low voltage characteristic and the DRAM macro 402 can be included into the logic LSI without deterioration of the final LSI characteristic to a large extent.

In addition, the sensing system circuit of the present invention of FIG. 1 has a characteristic that this circuit does not require a particular cell such as a dummy cell which has been required for the existing VDD precharge system, while having the characteristic of the existing VDD precharge system explained in the items (D1), (D2). Thereby, the manufacturing process and circuit can be simplified remarkably and the yield rate can also be improved to realize the effect for low manufacturing cost of LSI.

The symbol MOS in FIG. 1 of which gate electrode is indicated with a white box such as M206 indicates a high dielectric voltage MOS transistor formed of a thick gate oxide film, while that of which gate electrode is indicated with a line like M202 indicates a MOS transistor formed of a thin gate oxide film. A method for using the MOS of two kinds of the gate oxide film thickness has a merit, although not particularly restricted, that an adequate voltage can be impressed to the gate electrode through the structure explained in regard to this embodiment. Since it is enough when the dielectric strength of oxide film in the thin oxide film MOS explained previously is basically capable of covering the power source voltage VDD, a high speed MOS transistor may be used. The thick oxide film MOS explained later is capable of using the MOS which is the same as that used in the output stage of the I/O circuit of LSI and it is also enough when the dielectric strength of the oxide film can basically cover the voltage up to the I/O voltage VDDQ. An example of the basic selective use of the MOS transistor as in the case of FIG. 1 will be shown in the subsequent drawings. Moreover, there is no particular restriction in the threshold voltage of MOS transistors. A structure of the DRAM macro using the sensing circuit of the present invention and the logic LSI including DRAM using the same macro is not particularly restricted to the structure shown in FIG. 3 and FIG. 4.

Moreover, in above embodiment, it is explained that the potential amplitude of the bit line appears as VSS (0V) and VDL (1V). But this merit is particularly distinctive when VDL is equal to or less than 1.8V and moreover is ranged from 1.8V to 0.5V. This merit is common in the following embodiments.

Embodiment 2

Figure 5:
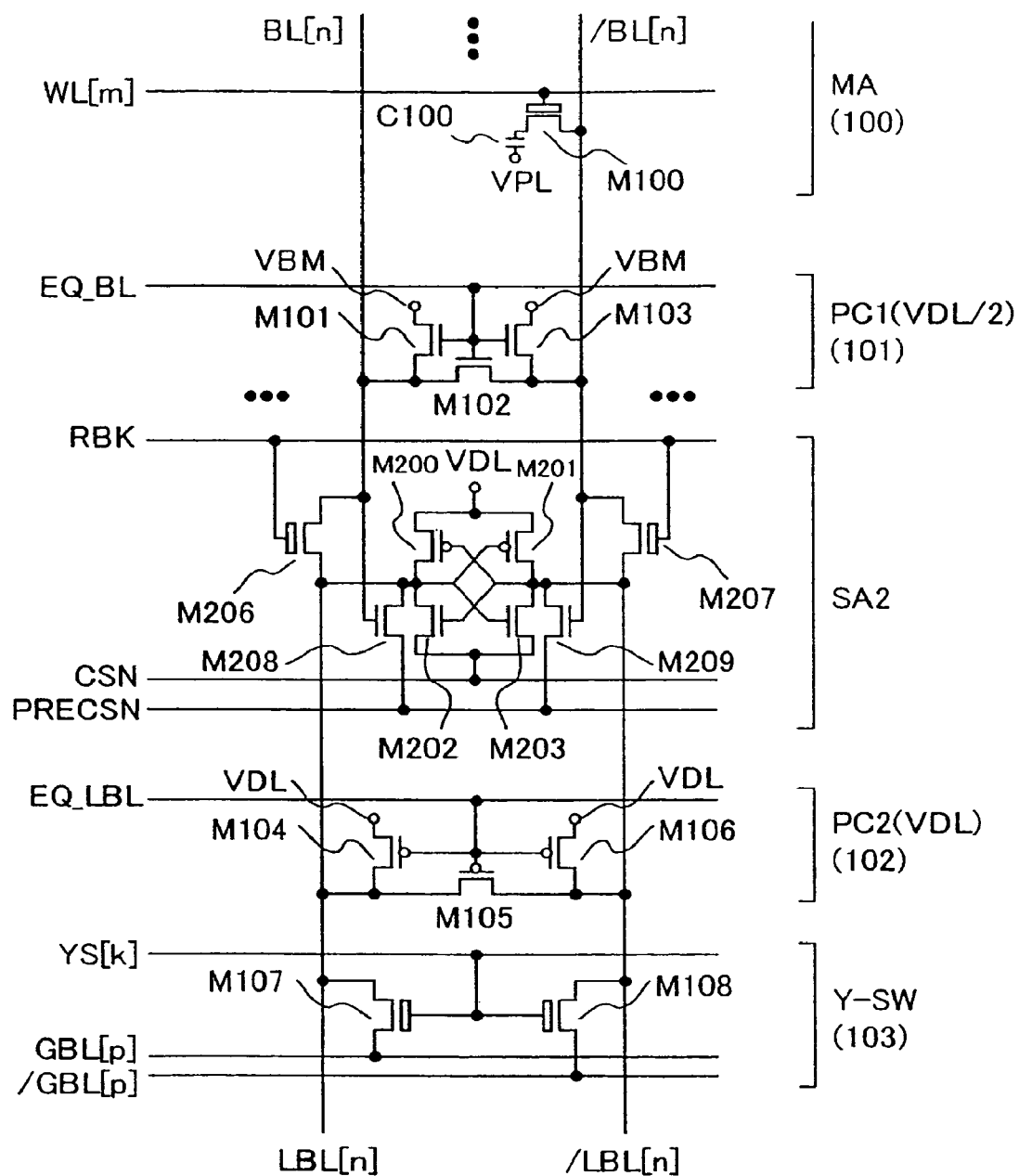
FIG. 5 is a diagram showing the other embodiment of the sensing system circuit of the present invention.

FIG. 5 shows another embodiment of the sensing system circuit of DRAM of the present invention. In FIG. 1, the MOS transistors M204, M205 in the sense amplifier connected with the bit lines BL[n], LBL[n] are respectively connected in series to M202 and M203. Meanwhile, in the sense amplifier SA2 of FIG. 5, M208 and M209 corresponding to M204 and M205 are connected in parallel to M202 and M203 to form a presense amplifier PSA in combination with M208 and M209. Moreover, the main sense amplifier MSA part is formed as a latch type circuit in which the M200 to M203 are included, sources of the M202 and M203 are coupled in common and the CMOS inverter is cross-connected. MSA and PSA are respectively isolated with the drive lines CSN and PRECSN for independent control.

A sense amplifier which is similar only in the circuit format is shown in FIG. 1 of the [Reference 3]. However, in the circuit of the [Reference 3], it is not considered, unlike the present invention, that the precharge level is different in the bit line BL and local bit line LBL and the switch circuits (M206, M207) are used for isolation and coupling of the BL and LBL.

Figure 6:
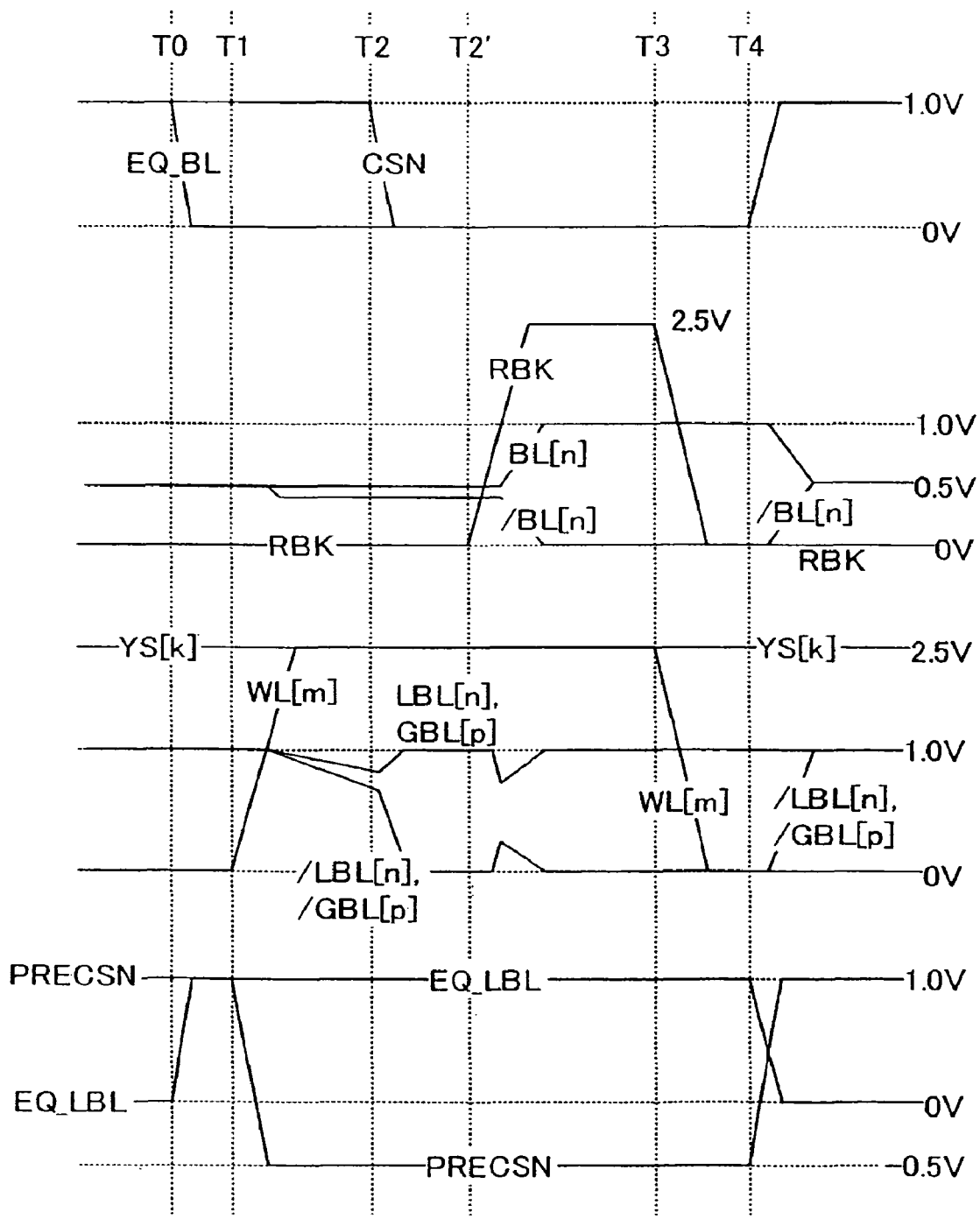
FIG. 6 is a diagram showing the read operation of FIG. 5.

FIG. 6 shows an example of the read operation waveforms of the sensing system of the embodiment shown in FIG. 5. The same explanation is eliminated by explaining only the part which is different from the read operation shown in FIG. 2. At the time T1, the word line WL[m] is asserted and simultaneously the drive signal PRECSN (source voltage of M208 and M209) of the pre-sense amplifier 202b shown in FIG. 5 is driven to −0.5V. Thereby, since the bit lines BL[n] and /BL[n] are connected to the gate electrodes of M208 and M209, the local bit lines LBL[n], /LBL[n] precharged to 1.0V are discharged as shown in the figure depending on the potentials of the bit lines BL[n], /BL[n]. At the time T2, the main sense amplifier 202a is activated by driving the CSN to 0V to amplify the potential difference of the local bit lines LBL[n], /LBL[n] generated through the discharge operation.

In the system of the embodiment shown in FIG. 1, the M204 and M205 are a part of the drive MOS transistor of the local bit lines LBL[n], /LBL[n] but since only a voltage around 0.5V is impressed to M204 and M205 even after the activation of the sense amplifier, a drive force of the local bit lines LBL[n], /LBL[n] is controlled with a weak drive force of the M204 and M205. Therefore, the MOS transistor having a low threshold value must be used for the M204 and M205 for the operation under a lower voltage condition in view of obtaining a large drive force even if only a voltage equal to a half of the power source voltage is impressed to the gate electrode. On the other hand, in the embodiment of FIG. 5, only the MOS transistors M202 and M203 drive the local bit lines LBL[n], /LBL[n] when the sense amplifier is activated and the MOS transistors M208 and M209 are used in the pre-sense period (the period from the time T1 to the time T2 in FIG. 6). Therefore, even when the low threshold voltage MOS transistors are not used for M208 and M209, high speed operation of the main amplifier 202a can be realized.

In the embodiment of FIG. 6, a drive signal PRECSN of the pre-sense amplifier 202b is driven up to −0.5V to drive the pre-sense amplifier consisting of M208 and M209 but the drive voltage of PRECSN is not particularly restricted.

However, since only a voltage of about 0.5V is applied at the time T1 to the gate electrodes of M208 and M209, the M208 and M209 can drive the local bit lines LBL[n], /LBL[n] at a high speed when the PRECSN is driven up to a negative voltage. Moreover, when the PRECSN is driven up to a negative voltage, a voltage difference between the source and gate of the M208 and M209 becomes larger. Accordingly, the local bit lines LBL[n], /LBL[n] can be driven with a drain current resulting from the drift current to match the pre-sense time characteristic up to the time T2 from the time T1 and the delay characteristic of the logic circuit.

When the PRECSN is driven up to a negative voltage, a drive force of the M208 and M209 becomes too large and when a voltage difference of about 100 mV which is enough to drive the main sense amplifier 202a is generated on the local bit lines LBL[n], /LBL[n], and therefore it is probable that both local hit lines LBL[n], /LBL[n] may be driven to the potential near to about 0.5V. Under this condition, the effect attained by precharging the local bit lines LBL[n], /LBL[n] connected to the main sense amplifier to the VDD is lost. In order to prevent such event while the PRECSN is driven to a negative voltage, the gate length Lg of the M208 and M209 is increased or the gate width W is narrowed to adjust a current of M208 and M209 to drive the local bit lines LBL[n], /LBL [n].

Embodiment 3

Figure 7:
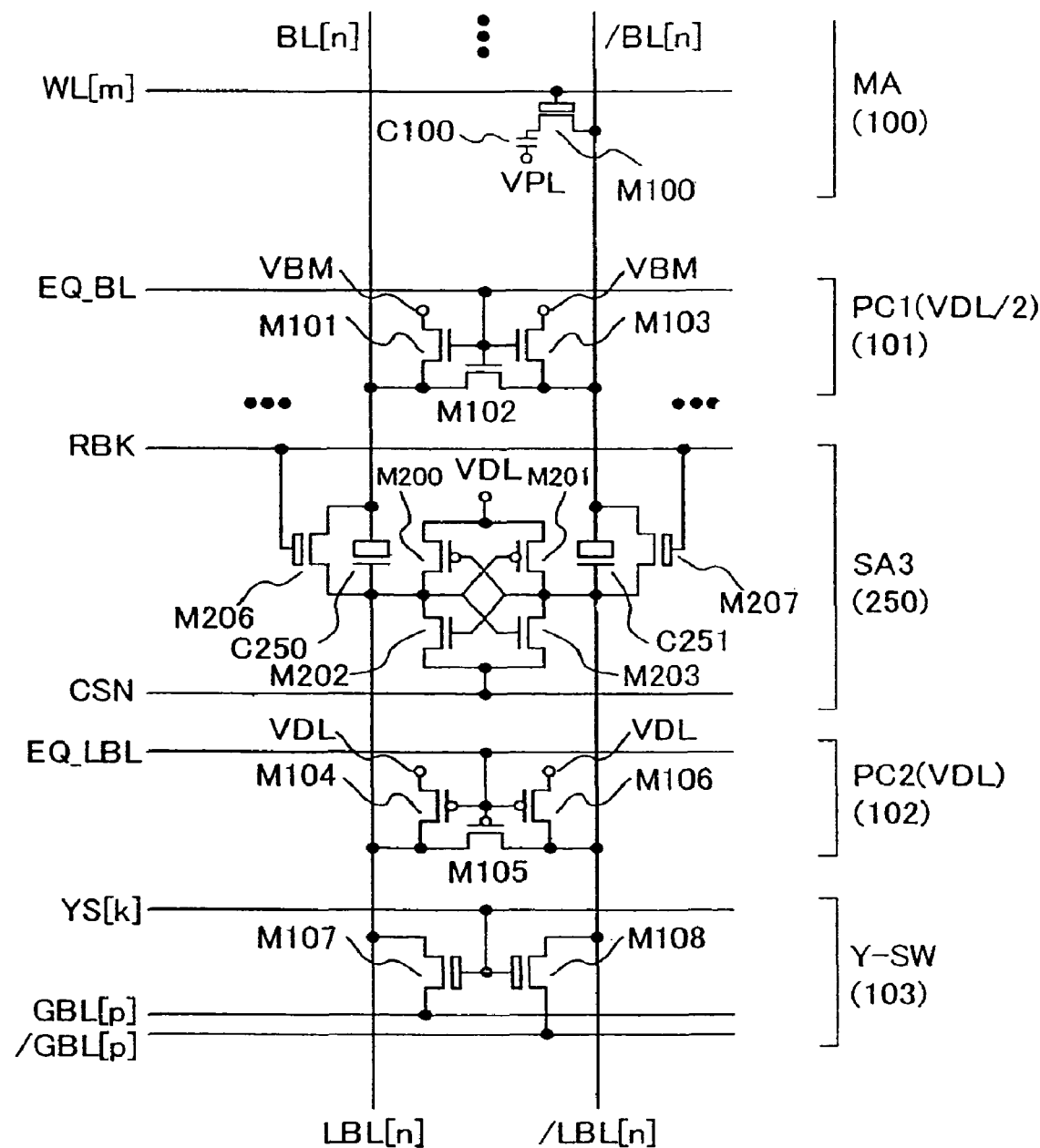
FIG. 7 is a diagram showing the other embodiment of the sensing system circuit of the present invention using capacitors.

FIG. 7 shows another embodiment of the sense amplifier of the present invention. In this embodiment, unlike FIG. 1 and FIG. 5, capacitors C250 and C251 formed of MOS transistors are connected between the bit lines BL[n], /BL[n] and the local bit lines LBL[n], /LBL[n]. In the embodiments of FIG. 1 and FIG. 5, a voltage difference of the bit lines BL[n], /BL[n] connected to the memory cell is detected as a drain current difference flowing corresponding to the gate voltage thereof by connecting the bit lines BL[n], /BL[n] to the gate electrode of the MOS transistor of pre-sense amplifier PSA in the sense amplifier. Meanwhile, in this embodiment, a voltage difference of the bit lines BL[n], /BL[n] connected to the memory cell is transferred to the local bit lines LBL[n], /LBL[n] through the capacitance couple (so-called AC coupling) of the capacitors. C250 and C251.

Figure 8:
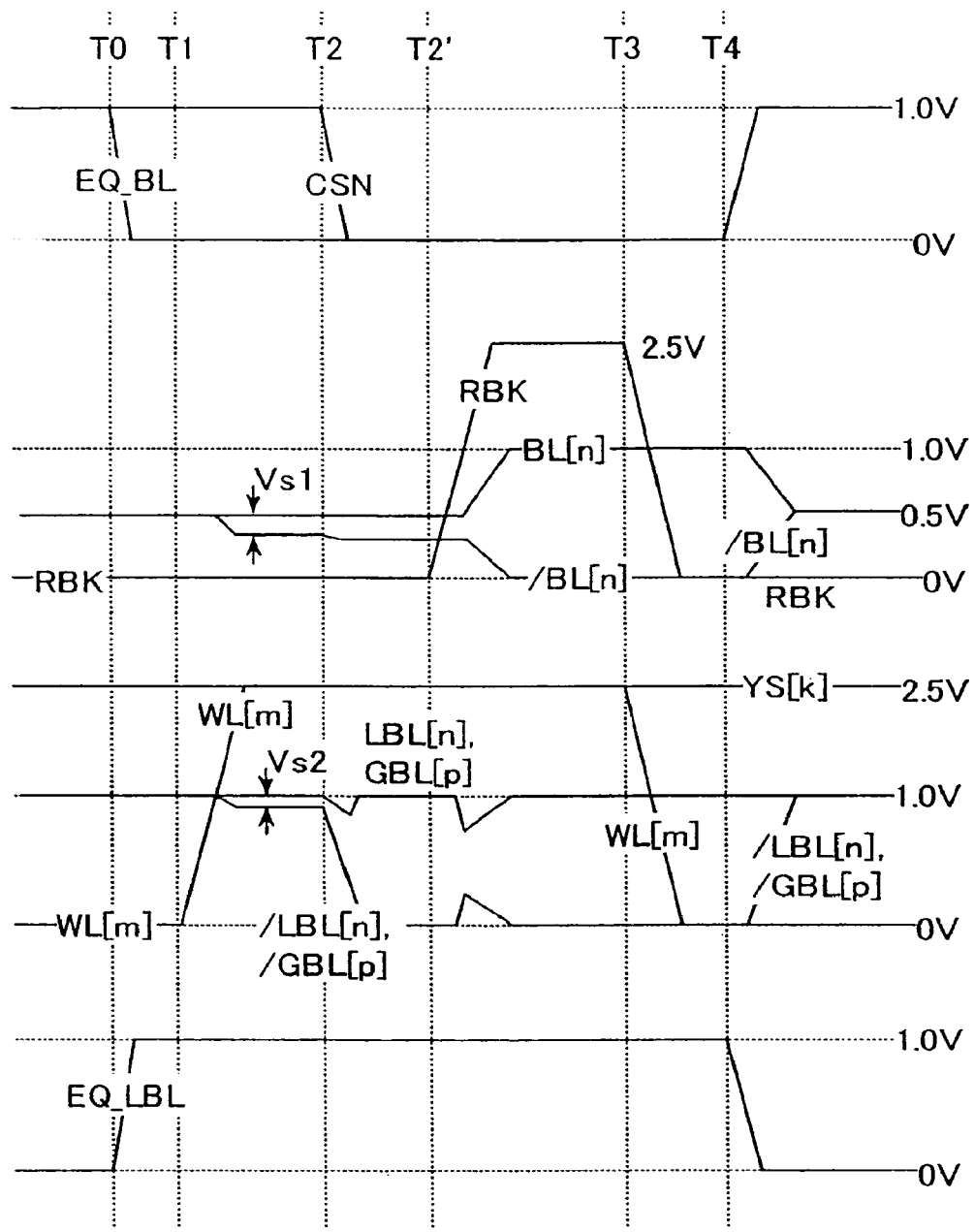
FIG. 8 is a diagram showing an embodiment of the read operation of FIG. 7.

FIG. 8 shows an example of the read operation waveforms of the sensing system in the embodiment of FIG. 7. Here, only a part different from the read operation explained with reference to FIG. 2 and FIG. 6 will be explained to eliminate duplicated explanation. When the word line WL[m] is asserted at the time T1, a voltage difference Vs1 corresponding to the information within the memory cell is generated to the bit lines BL[n], /BL[n] connected to the memory cell. This potential difference is transferred to the local bit lines LBL[n], /LBL[n] through the capacitance coupling of the capacitors C250, C251 of FIG. 7 and thereby a potential difference Vs2 is generated in the local bit lines LBL[n], /LBL[n]. Thereafter, the sense amplifier activate signal CSN is asserted at the time T2 to activate the sense amplifier and the potential difference Vs2.

Here, although it is not particularly restricted, it is preferable that a structure of the capacitors C250 and C251 is formed with MOS capacitor based on the NMOS transistor. The capacitor utilizing a gate capacitance of the MOS transistor has a property that capacitance changes depending on the potential difference between the gate and source/drain. Namely, when the potential difference between the gate and source/drain is large, a channel is formed to the MOS transistor and a capacitance is large and when the potential difference between the gate and source/drain is small, a channel disappears the a capacitance becomes small. Hereinafter, such effect is called the capacitance modulation effect.

In FIG. 8, a potential difference Vs2 of the local bit lines LBL[n], /LBL[n] is amplified by activating the sense amplifier at the time T2, but the capacitance of the bit lines BL[n], /BL[n] becomes large via the capacitance coupling through the C250 and C251 from the local bit lines LBL[n], /LBL[n] Therefore, the following points must be taken into consideration to drive, at a high speed, the local bit lines LBL[n], /LBL[n] with the sense amplifier.

(E1) Any one of local bit lines LBL[n], /LBN[n] driven for the low voltage side (LBL[n] in FIG. 8) must be driven at a high speed to the row side, when it is driven, by virtually lowering a parasitic capacitance added to the bit line /BL[n]. For this purpose, it is preferable to provide a capacitor C251 having a smaller capacitance between the local bit line /LBL[n] and the corresponding bit line /BL[n].

(E2) Any one of local bit lines LBL[n], /LBL[n] driven for the high voltage side (LBL[n] in FIG. 8) must preferably be held in the high voltage side, when it is driven, without driving the local bit line /LBL[n] to the low voltage side with the parasitic capacitance when the sense amplifier is driven by virtually increasing the parasitic capacitance added to the bit line BL[n]. For this purpose, it is preferable that a capacitance C250 provided between the local bit line LBL[n] and the corresponding bit line BL[n] has a large capacitance.

The contents of items (E1) and (E2) can be realized automatically with the capacitance modulation effect explained above by using a capacitor utilizing the NMOS transistor as the capacitors C250 and C251.

A connection method when the MOS transistor is used for the capacitors C250 and C251 (the gate electrode is connected to the local bit line in FIG. 7) and the method of setting the substrate potential are not particularly restricted. However, the relationship between Vs1 and Vs2 of FIG. 8 is determined based on the charge sharing between the capacitance Ca of the capacitors C250, C251 and the parasitic capacitance Cp added to the local bit lines LBL[n], /LBL[n] Namely, Vs2=Vs1*Ca/(CP+Ca). Therefore, it is recommended to make small Cp as much as possible when Ca is assumed to be constant. A value of Cp can be reduced as much as a junction capacitance of a diffusion layer of the MOS transistor forming the C250 and C251 by connecting the gate electrode to the local bit line such as C250 and C251.

Embodiment 4

An embodiment of the sensing system circuit of the present invention is shown in FIG. 1, FIG. 5 and FIG. 7 but it is enough, in short, when the bit lines BL[n], /BL[n] connected to the memory cell and the local bit lines LBL[n], /LBL[n] connected to the sense amplifier are electrically isolated, the bit lines BL[n], /BL[n] are precharged to the half VDD, the local bit lines LBL[n], /LBL[n] are precharged to the VDD and a voltage difference is generated in the local bit lines LBL[n], /LBL[n] corresponding to the voltage difference of the bit lines BL[n], /BL[n] generated when the word line WL[m] is asserted at the time of read operation. A structure of the sense amplifier connected between the bit lines BL[n], /BL[n] and the local bit lines LBL[n], /LBL[n] is not restricted to that shown in FIG. 1, FIG. 5 and FIG. 7. For example, the structure shown in FIG. 9 may be used.

FIG. 9 shows a structure in which the CMOS latch type sub-sense amplifier SSA consisting of the MOS transistors of M290 to M293 is added to the embodiment shown in FIG. 5. The main sense amplifier MSA includes M200 to M203 and is same as the MSA of FIG. 5. But, in the pre-sense amplifier PSA (M208, M209), the sources which are connected in common are connected to the input/output node of the sub-sense amplifier SSA. The activate signals CSP2 and CSN2 of the sub-sense amplifier are precharged, before the activation, to the VBM potential as shown by the waveforms of FIG. 9 and are driven to 10V and 0V at the time T2 in the same timing as the sense amplifier activate signal CSN.

When the sub-sense amplifier 290 is activated, the bit lines BL[n], /BL[n] which are precharged to the half VDD are amplified and simultaneously a current flowing into the M208 and M209 accelerates the amplifying operation of the main sense amplifier 202a consisting of M200 to M203. As a result, the local bit lines LBL[n], /LBL[n] precharged to the VDD are amplified at a high speed up to 1.0V and 0V. Moreover, since the sub-sense amplifier simultaneously amplifies the bit lines BL[n], /BL[n], the charging time of the bit lines BL[n], /BL[n] can be shortened when the write back signal RBK is activated at the time T2'.

When it is not so much required to consider the rate of re-write operation, the re-write operation may be conducted only with the sub-sense amplifier 290 by eliminating the M206 and M207.

The effect of shortening the time required for the re-write operation can also be obtained by adding a sub-sense amplifier 290 consisting of M290 and M293 to the bit lines BL[n] /BL[n] of the sensing system circuit of the present invention of FIG. 1, FIG. 5 and FIG. 7. Moreover, it is of course possible to delete the NMOS transistors M206 and M207 for re-write operation.

Various structures of sense amplifier can be considered when there is no particular restriction on the number of transistors and on the area as explained above and these structures are also not placed under the particular restriction.

Embodiment 5

As the other embodiment, it is also possible that the bit lines BL[n], /BL[n] connected to the memory cell and is precharged to the half VDD and the local bit lines LBL[n], /LBL[n] connected to the sense amplifier are electrically isolated immediately before the sense amplifier is activated, the local bit lines LBL[n], /LBL[n] are simultaneously driven through the capacitance coupling and the local bit lines LBL

[n], /LBL[n] are precharged to the VDD when the sense amplifier is activated. FIG. 1 shows an embodiment to realize this purpose.

Figure 10:
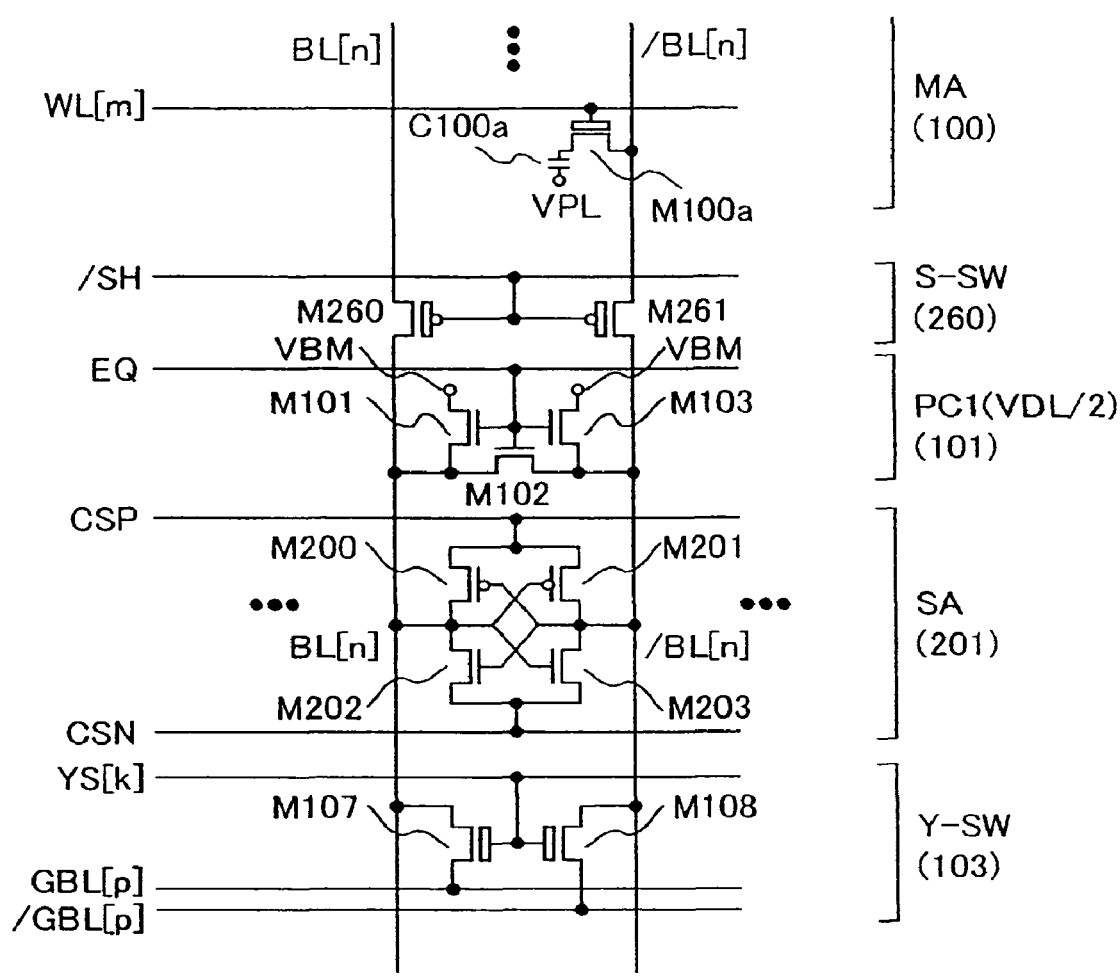
FIG. 10 is a diagram showing the other embodiment of the sensing system circuit of the present invention.
Figure 18:
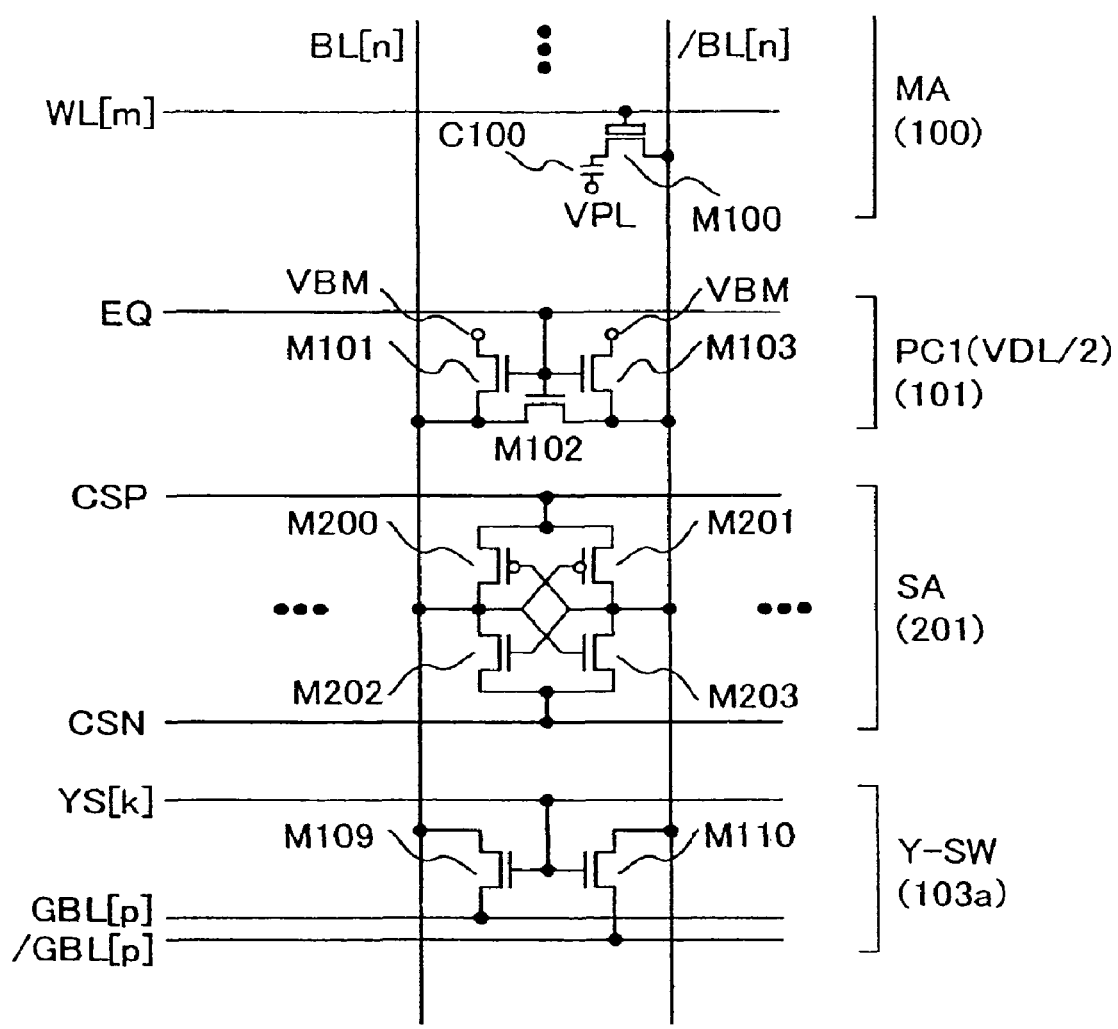
FIG. 18 is a diagram showing the existing sensing system circuit.

The sensing system circuit of the present invention of FIG. 10 inserts, in comparison with the sensing system circuit of FIG. 18, the PMOS transistors M260 and M261 to the bit lines BL[n], /BL[n] of FIG. 18 to control these transistors with a bit line isolation signal /SH.

Figure 11:
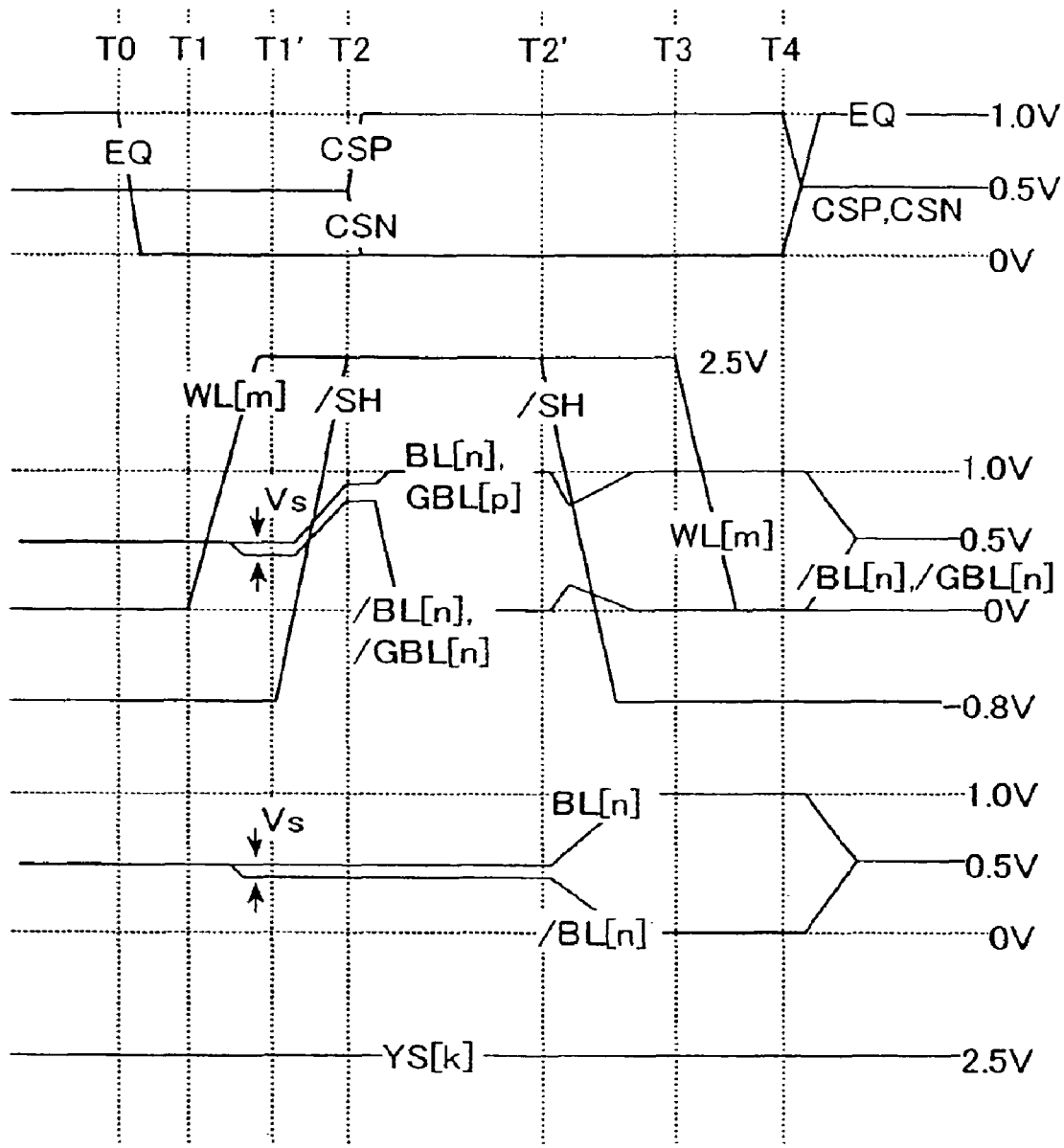
FIG. 11 is a diagram showing an embodiment of the read operation of FIG. 10
Figure 19:
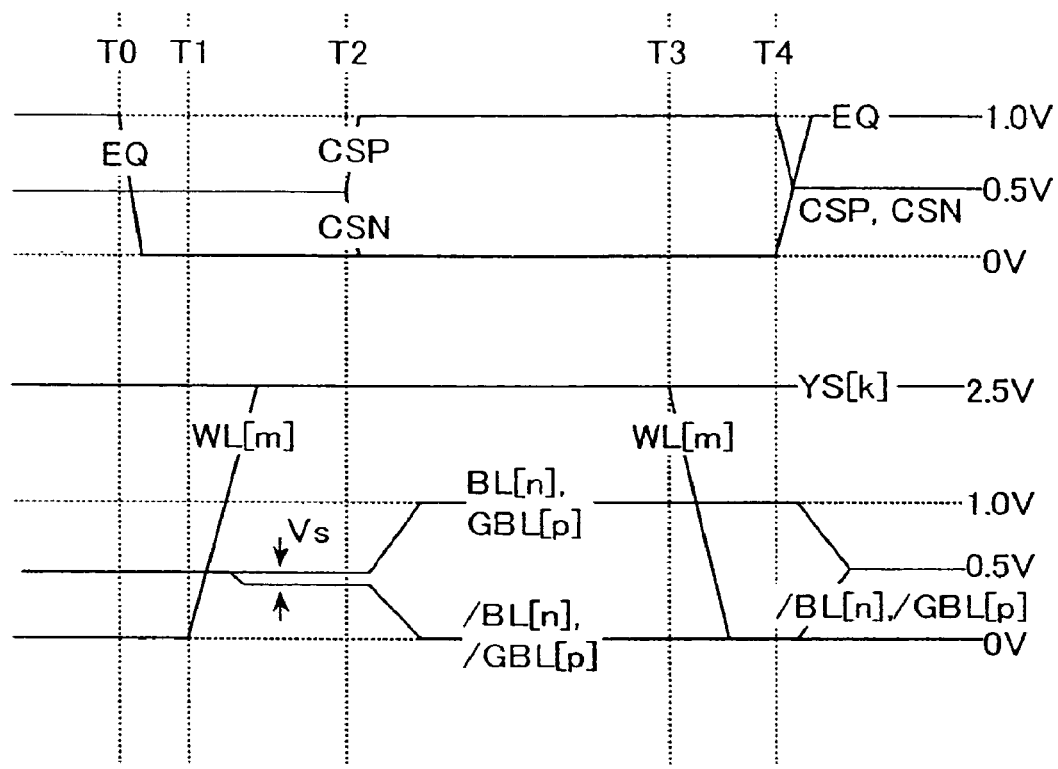
FIG. 19 is a diagram showing an example of discussion of the read operation of FIG. 18 discussed by the inventors of the present invention.

FIG. 11 shows an example of read operation waveforms of the sensing system in the embodiment of FIG. 10. In this figure, only a part different from the read operation of FIG. 19 is explained to eliminate duplicated explanation. After the word line WL[m] is asserted at the time T1, the bit line isolation signal /SH is driven up to 2.5V from −0.8V at the time T1'. Thereby, the bit lines BL[n], /BL[n] are electrically isolated from the local bit lines LBL[n], /LBL[n] and moreover the local bit lines LBL[n], /LBL[n] are simultaneously driven to the high level through the capacitance coupling between the gate and drain of the M260 and M261 or between the capacitances of gate and source. Thereafter, the sense amplifier 201 is driven at the time T2 to amplify the memory cell information to the local bit lines LBL[n]. /LBL[n]. At the time T2', the bit line isolation signal /SH is driven up to −0.8V from 2.5V, the bit lines BL[n], /BL[n] and the local bit lines LBL[n], /LBL[n] are electrically connected and the bit lines BL[n], /BL[n] are driven to 1V and 0V to conduct re-write operation to the memory cell.

When the sense amplifier is driven at the time T2, the local bit lines LBL[n], /LBL[n] connected to the sense amplifier are driven up to a voltage near the power source voltage from the voltage near to 0.5V. Therefore, the low voltage characteristic which is similar to that when the sensing system circuit of FIG. 18 is precharged to the VDD can be attained.

In FIG. 10, the PMOS transistor has been used for the M260 and M261, but the NMOS transistor may also be used. In this case, the signal /SH is driven to a negative voltage from a positive voltage at the time T1' and the local bit lines LBL n), /LBL[n] are simultaneously driven to the low voltage side through the capacitance coupling. As a result, the characteristic similar to that when the sensing system circuit of FIG. 18 is precharged to the voltage VSS can be obtained. In general, since the VDD precharge system is mainly used for driving of the bit lines by the NMOS transistors at the time of driving the bit lines with the sense amplifier, this VDD precharge system has the more excellent low voltage characteristic than the VSS precharge system. However, the low voltage characteristic which is remarkably preferable to that of the half VDD precharge system can be attained with the VSS precharge system.

The sensing system circuit disclosed in the [Reference 4] may be considered as a technique similar to the embodiment of the present invention shown in FIG. 10. The [Reference 4] discloses that the bit lines connected to the memory cell are isolated electrically from the sense amplifier before activation of the sense amplifier (sense operation 1), thereafter the bit lines are driven to the high level through the capacitance coupling with the capacitor adding the bit lines in the side where the sense amplifier is connected after a constant period (sense operation 2) and thereafter the bit lines activate the sense amplifier (sense operation 3).

This embodiment of the present invention is different from the [Reference 4] mainly in the following two points.

(F1) In the method of the [Reference 4], it is necessary to add the capacitance for driving the bit lines in the side connected to the sense amplifier through the capacitance coupling. In the method of the present invention, the signal /SH is set to a sufficiently large value and moreover the local bit lines are driven with the parasitic capacitances of the M260 and M261. Therefore, it is not particularly required to add this capacitance.

(F2) In the method of the [Reference 4], the timing up to the sense operation 3 from the operation 1 is required as explained above up to the activation of the sense amplifier. In the present invention, the sense operation 1 and sense operation 2 can be done simultaneously.

In order to realize close capacitance coupling between the signal /SH when this signal is activated and the local bit lines LBL[n], /LBL[n], it is also possible to add respectively the capacitances between the gate electrode of M260 and the local bit line LBL[n] and between the gate electrode of M260 and local bit line /LBL[n]. In this case, the capacitor may be formed of the NMOS transistor. Moreover, it is also required to add the capacitor as in the case of the [Reference 4], but the method of the present invention is only a complementary method having a merit that a capacitor having a small capacitance value may also be used. Moreover, the merit that the sense operation 1 and the sense operation 2 can be conducted simultaneously which has been required for the [Reference 4] is still maintained.

Embodiment 6

Figure 12:
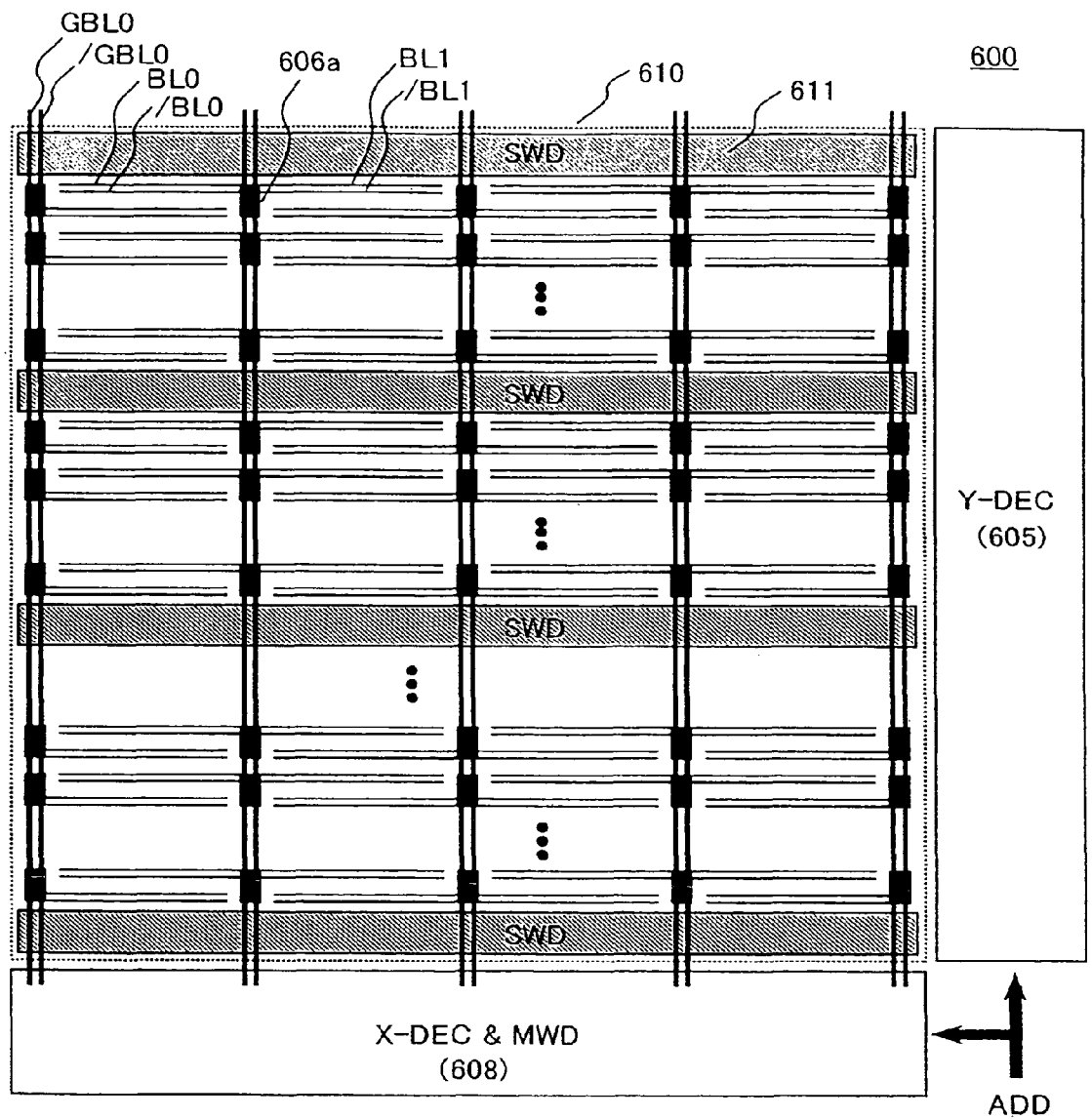
FIG. 12 is a diagram showing an embodiment of the DRAM macro using a shared sense amplifier system.

The sensing system circuit explained in above embodiments is illustrated as a circuit of the format not introducing the so-called shared sense amplifier system but this sensing system circuit is never restricted thereto. FIG. 12 shows an embodiment where the shared sense amplifier system is used. Here, a hierarchical word line drive system, which has not been particularly restricted in the embodiments shown in the figures up to FIG. 11, is used. SWD 611 is a sub-word decoder, Y-DEC 605 is a Y decoder, X-DEC&MWD 608 indicates an X-decoder and main word driver. BL0, /BL0 and BL1, /BL1 respectively indicate the bit line pairs which are connected to one sensing system circuit 606a. The global bit lines GBL0, /GBL0 are wired in the direction (direction parallel to the word line) crossing in orthogonal the bit lines. The control signal of the DRAM circuit 600 and data line are omitted.

Since many components of the sensing system circuit may be used in common with two pairs of bit lines by introducing the shared sense amplifier system, a memory cell occupation coefficient may be enhanced. When the sensing system circuit of the present invention is used for the DRAM of higher integration density which is used for the main memory or the like of the microprocessor called so-called the general purpose DRAM, instead of the DRAM macro included into the logic LSI, it is important to enhance the memory cell occupation coefficient. In such application field, it is enough when the sensing system circuit of the present invention is used in the shared sense amplifier system. An embodiment where the sensing system circuit of FIG. 1, FIG. 5, FIG. 7 and FIG. 10 is changed to the shared sense amplifier system will be explained below.

Figure 13:
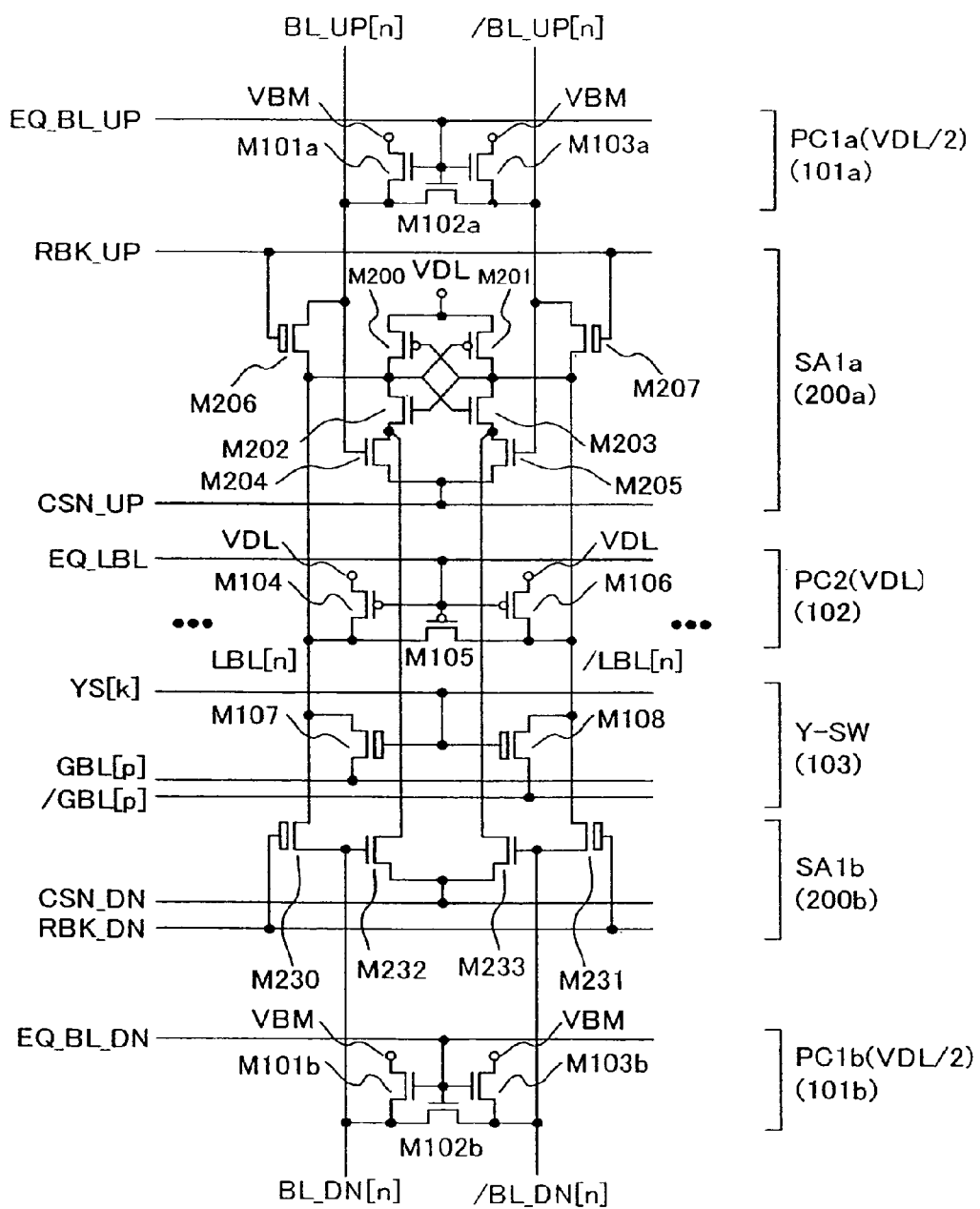
FIG. 13 is a diagram showing an embodiment when the sensing system circuit of FIG. 1 is changed to a shared sense amplifier system.

FIG. 13 shows an embodiment where the sensing system circuit of FIG. 1 is changed to the shared sense amplifier system and the memory array MA is omitted. In the shared sense system, the right and left memory mats (vertical memory mats in FIG. 13) are required but the main sense amplifier including M200 to M203 is used in common by the right and left mats. Meanwhile, the pre-sense amplifier is provided with a first pre-sense amplifier PSA_UP including M204 and M205 for the first mat and a second pre-sense amplifier PSA_DN including M232 and M233 for the second mat. Moreover, the precharge circuits (PC1a, PC1b) for VBM (VDL/2) are provided respectively for the right and left mats.

In the circuit of FIG. 13, the NMOS transistors up to M233 from M230 and the half VDD precharge circuit 101b consisting of M101b to M103b are added to FIG. 1 and the memory cell is connected to the bit lines BL_UP[n], /BL_UP[n] and BL_DN[n], /BL_DN[n]. Explanation of the read operation of the embodiment of FIG. 13 is omitted here because it may be assumed easily from the embodiments of FIG. 1 and FIG. 2. Here, it is impossible to simultaneously read or write the data from or to the memory cell connected to the bit lines BL_UP [n], /BL_UP[n] or the memory cell connected to the bit lines BL_DN[n], /BL_DN[n] but it is possible to access to any one of them with the common sense amplifier.

Figure 14:
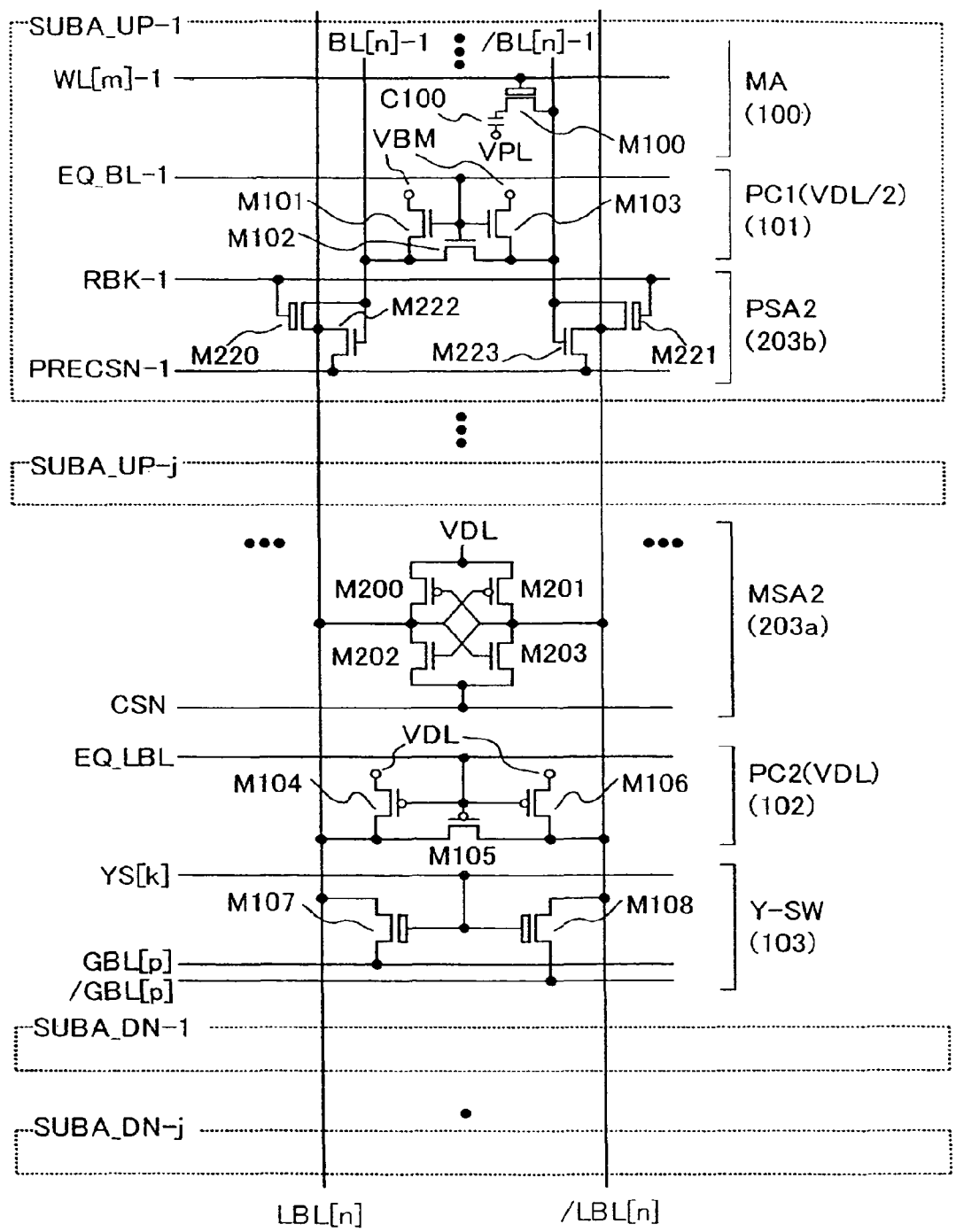
FIG. 14 is a diagram showing an embodiment when the sensing system circuit of FIG. 5 is changed to the shared sense amplifier system.

FIG. 14 shows an embodiment where the sensing system circuit of FIG. 5 is changed to the shared sense amplifier system. In the embodiment of FIG. 14, the shared sense amplifier system is introduced and the bit lines are formed in the hierarchical structure. SUBA_UP-1 to SUB_UP-j are sub-memory arrays, each of which is composed of the pre-sense amplifier PSA1 (203b) including the sub-bit lines BL[n]-1, /BL[n]-1 and M222 and M223 and the half VDD precharge circuit 101 SUBA_DN-1 to SUBA_DN-j are also sub-memory arrays which are disposed, as the physical layout thereof, in the opposite side of the SUBA_UP-1 to SUBA_UP-j in the sense amplifier 203a, VDD precharge circuit 102 and Y switch 103. The main sense amplifier MSA2 (203a) and VDL precharge circuit PC2 are provided in common to a plurality of sub-memory arrays. The read operation of the embodiment of FIG. 14 can be easily estimated from the operations of FIG. 5 and FIG. 6 and therefore explanation of such read operations is omitted here.

In the sensing system circuit of DRAM, it has been required to increase a capacitance of the capacitor C100 within a memory cell so that a potential difference Vs of the bit lines read to the bit lines from the memory cell after the assertion of the word lines has a certain value during the low voltage operation. Therefore, here rises a problem that difficulty of process becomes high. Since the bit lines are formed in the hierarchical structure in the embodiment of the present invention of FIG. 14, the bit lines BL[n]-1, /BL[n]-1 can be shortened and the number of memory cells connected to these bit lines can be reduced. Therefore, a capacitance value of the capacitor C100 in the memory cell can be reduced and thereby this problem during the low voltage operation can be solved.

Figure 15:
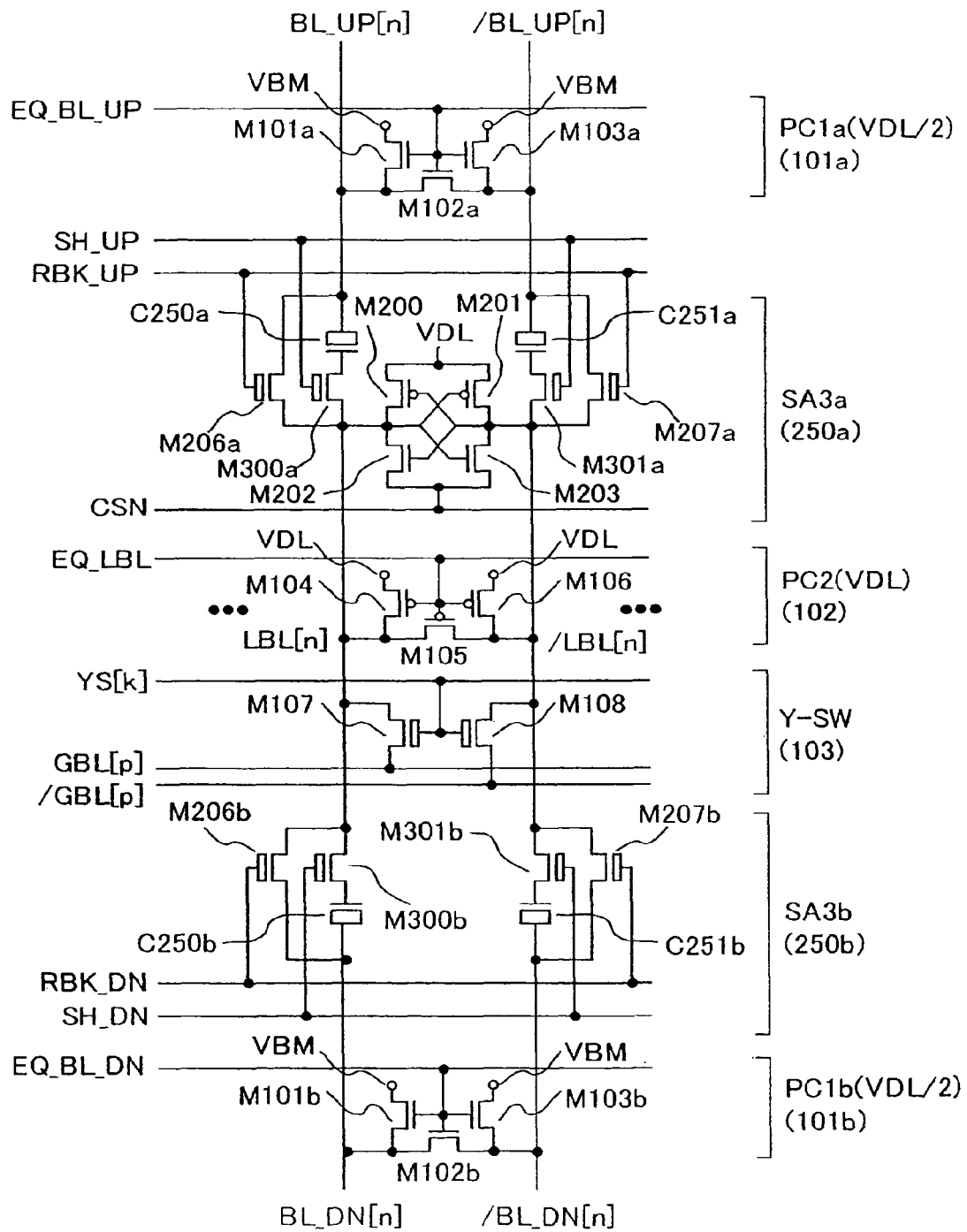
FIG. 15 is a diagram showing an embodiment when the sensing system circuit of FIG. 7 is changed to the shared sense amplifier system.

FIG. 15 shows an embodiment where the sensing system circuit of FIG. 7 is changed to the shared sense amplifier system. Here, memory cells are omitted. In comparison with the embodiment of FIG. 7, M300a and M301a are provided for electrically isolating the local bit lines and the half VDD precharge circuit 101b consisting of NMOS transistors M206b, M207b, M300b, M301b and M101b, M102b, M103b is added.

The read operation in the embodiment of FIG. 15 can be easily estimated from the embodiments of FIG. 7 and FIG. 8 and therefore explanation of this read operation is omitted here. Here, it is impossible to simultaneously conduct the read or write operation to or from the memory cell connected to the bit lines BL_UP[n], /BL_UP[n] or to the memory cell connected to the bit lines BL_DN[n], /BL_DN[n], but any one of the memory cells can be accessed by driving any one of the SH_UP or SH_DN to the voltage of about 2.5V.

Figure 16:
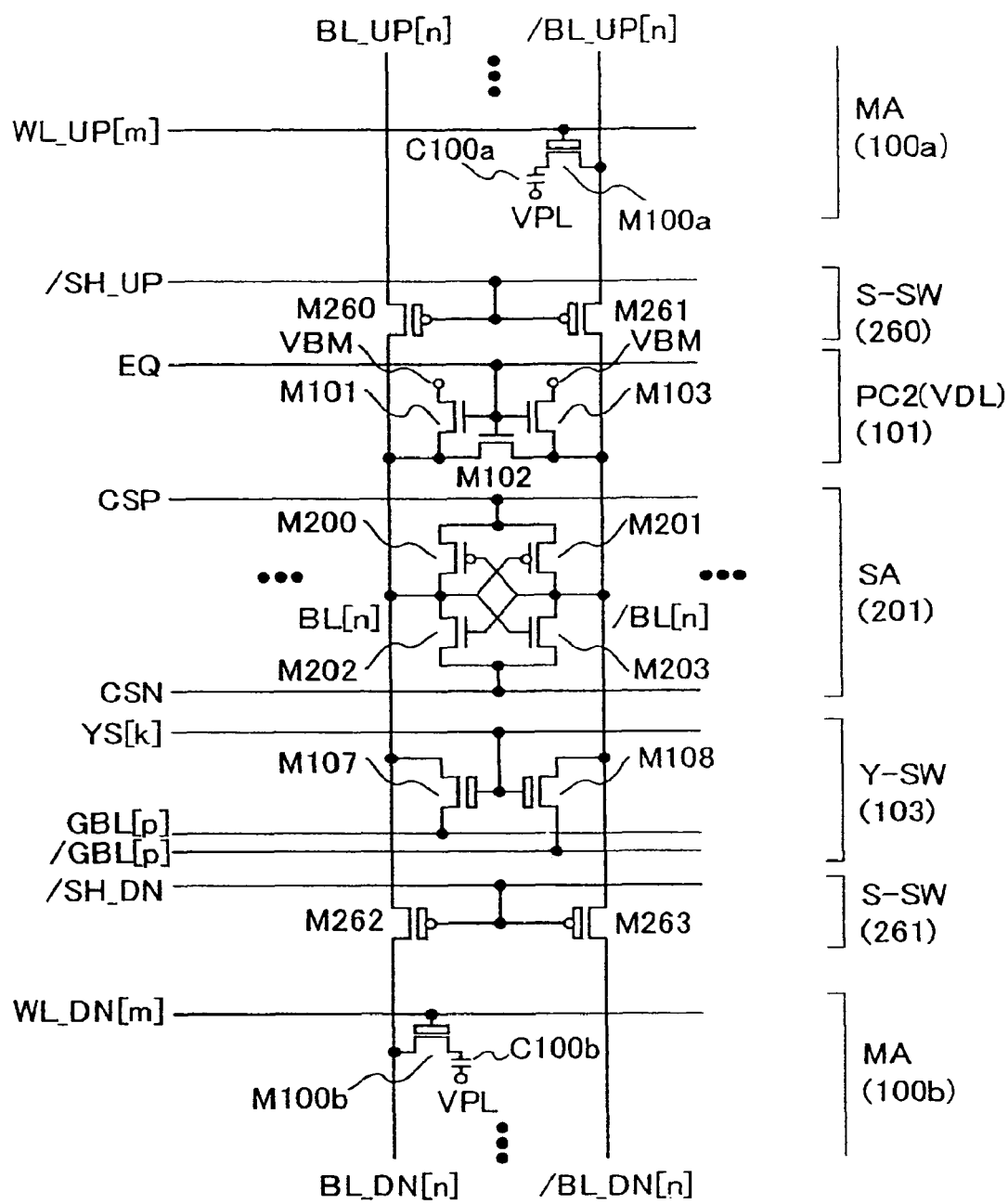
FIG. 16 is a diagram showing an embodiment when the sensing system circuit of FIG. 10 is changed to the shared sense amplifier system.

FIG. 16 shows an embodiment where the sensing system circuit of FIG. 10 is changed to the shared sense amplifier system. Here, the memory cells are omitted. In comparison with the embodiment of FIG. 10, the M262 and M203 are newly provided and are then controlled with a bit line isolation signal /SH_DN.

The read operation of the embodiment of FIG. 16 can easily be estimated from the embodiments of FIG. 10 and FIG. 11 and therefore explanation of this read operation is omitted here. It is impossible to simultaneously conduct the read or write operation from or to the memory cell connected to the bit lines BL_UP [n], /BL_UP [n] or to the memory cell connected to the bit lines BL_DN[n], /BL_DN[n], but any one of memory cells can be accessed by driving any one of the /SH_UP or /SH_DN to the voltage of about 2.5V.

In the following embodiments, the sensing system circuit is shown, to simplify the explanation, as the circuit format not introducing the so-called shared sense amplifier system, but it is apparent the circuit may be changed to the shared sense amplifier system as explained above.

Embodiment 7

One of the characteristics of the sensing system circuit of the present invention explained above is that the local bit lines LBL[n], /LBL[n] connected to the sense amplifier are pre-charged to the voltage VDD. Owing to the VDD precharge, the low voltage characteristic in the sense time of the sense amplifier is matched with that of the logic circuit but the sensing system circuit of the present invention also has the other merits. One of such merits is that the end of amplification by the sense amplifier can be detected easily FIG. 17 shows an embodiment of the sensing system circuit and peripheral circuit.

Figure 17:
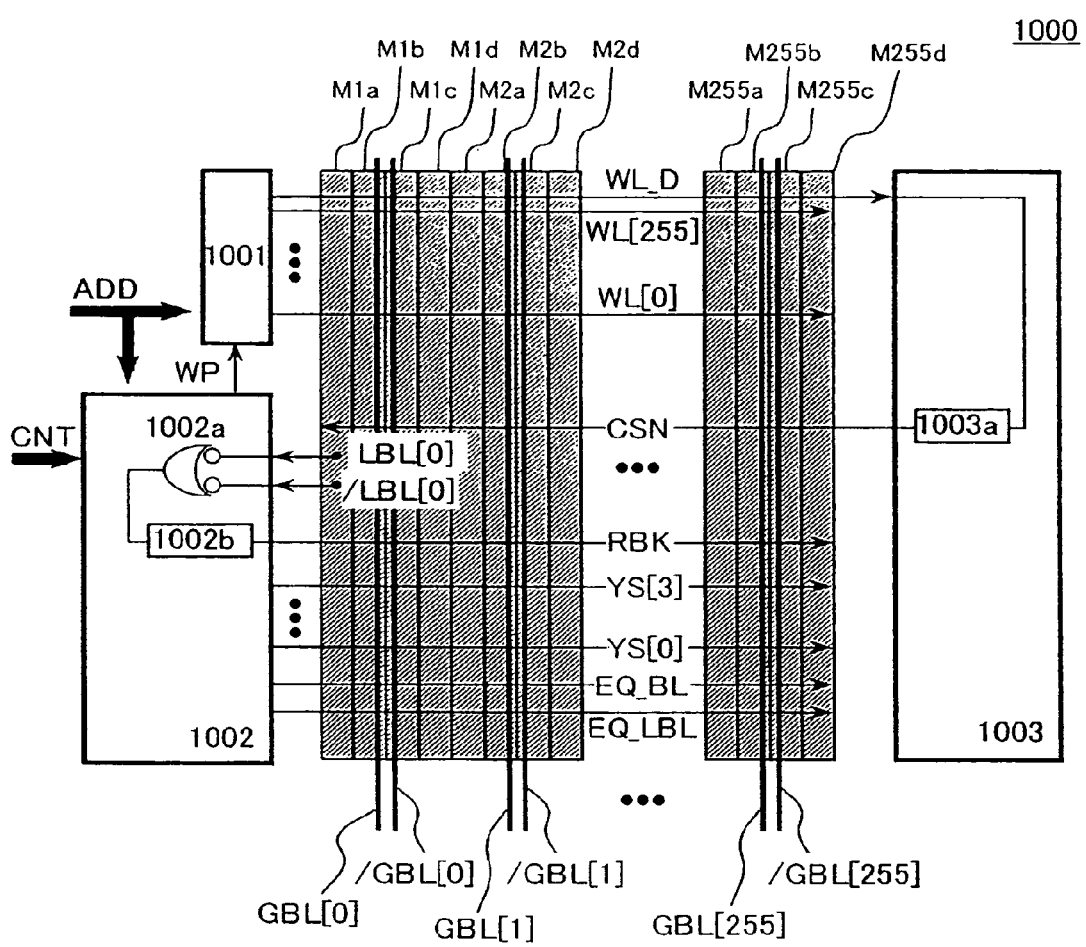
FIG. 17 is a diagram showing a control system of the DRAM of the present invention where a circuit for detecting the end of operation of the sense amplifier is loaded.

In FIG. 17, m1a to m255d are sensing system circuits shown in FIG. 1. Four sensing system circuits are connected to a pair of global bit lines GBL[ ], /GBL[ ] For example, m1a to m1d are connected to the GBL[0] and GBL[1]. (It means that a degeneration degree is 4.) 1001 designates a word decoder, 1002, a control circuit for signal line such as RBK and 1003, a word line potential detecting circuit.

Only one of the word lines WL[0] to WL[255] is driven with the word decoder 1001. Simultaneously, the dummy word line WL_D is driven to detect that the dummy word line is asserted with the detecting circuit 1003a. Although not particularly restricted, a structure of the detecting circuit 1003a may be realized by adjusting the threshold value of an ordinary inverter. Assertion of the word line is detected and the CSN is also asserted. Thereby, the sense amplifier is activated and any one of the local bit lines LBL[0], /LBL[n] precharged to the voltage VDD is driven to 0V. Potential change of a pair of the local bit lines is detected with a sense end detecting circuit 1002a within the control circuit. Thereafter, the RBK is asserted to execute the re-write operation to the memory cell.

For example, the read operation of memory from the assertion of word line can be executed perfectly in any timing with the embodiment of FIG. 1 by amplifying the potentials of the global bit lines GBL[ ], /GBL[ ] with the circuit not shown in FIG. 17 simultaneously with the assertion of RBK of the re-write operation.

In order to detect the end of amplification of the local bit lines of the sense amplifier, a potential difference of the bit line pair must be detected in the case of the half VDD precharge system of the prior art and therefore the circuit structure is complicated because it is difficult to detect such potential difference with a logic gate such as the simple NAND gate or the like. Meanwhile, in the present invention, since the end of amplification of the sense amplifier can be detected when any one of the local bit line pair is driven to 0V from 1V, the sense end detecting circuit 1002*a* can be realized easily with a 2-input NAND gate.

Moreover, the present invention can also provide another effect that the minimum value Vsmin required for accurate operation of the sense amplifier can be set to a smaller value in comparison with the sensing system circuit of DRAM of the prior art for the bit line potential difference Vs which is read on the bit line from the memory cell after the assertion of the word line. Therefore, operation voltage can be lowered, structure of the capacitor in the memory cell can be simplified and the manufacturing process can also be simplified.

In usual, due to the fluctuation of characteristics of the MOS transistors in the sense amplifier and unbalance of capacitance of the bit line pair in the complementary relationship, a certain Vs, for example, about 150 mV is necessary to accurately read the memory cell information by activating the sense amplifier.

In the prior art, a diffusion current of the MOS transistor can be used as an activation current of the sense amplifier immediately after the sense amplifier is activated, but a drive current resulting from the drift current may also be used in the present invention. In general, the diffusion current largely depends on the threshold voltage and changes to a large extent depending on fluctuation of manufacturing process. On the other hand, fluctuation of the drift current is rather small. Therefore, the amplification operation which is not sensible to fluctuation of characteristic fluctuation of MOS transistors in the sense amplifier can be realized in the VDD precharge system.

Moreover, in the sensing system circuit of the present invention, the local bit lines connected to the sense amplifier is rather short and the parasitic capacitance added to its local bit lines is also small. Therefore, unbalance of capacitance added to the local bit lines is small and therefore does not easily apply an influence on the operation of sense amplifier.

From above explanation, the sensing system circuit of the present invention is capable of conducting the sufficiently accurate read operation with the potential difference of bit lines Vs which is smaller than the minimum Vs (Vsmin) required by the sensing system circuit of the prior art.

Embodiment 8

Figure 22:
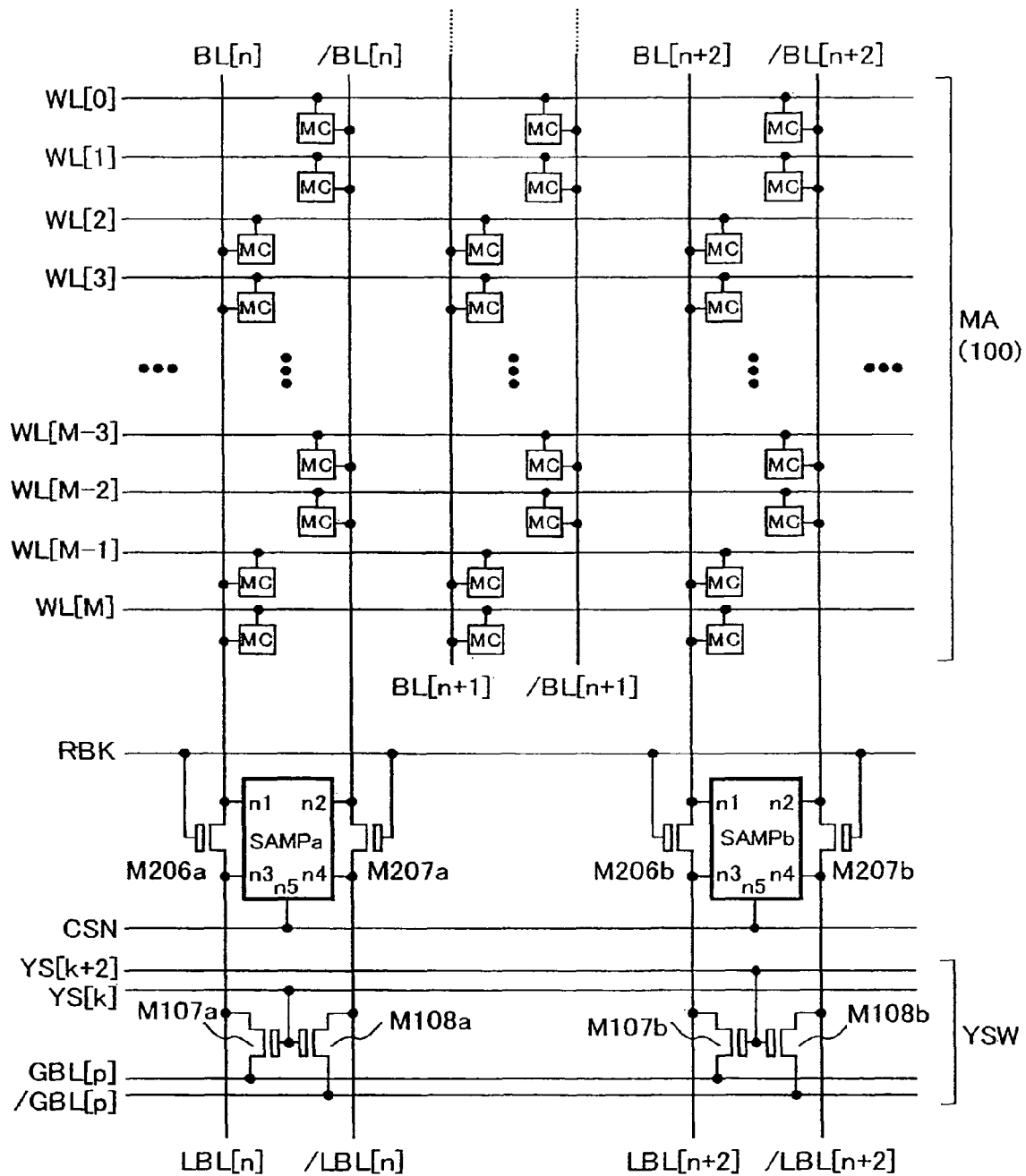
FIG. 22 is a diagram showing an embodiment when a memory array is formed using the sensing system circuit of the present invention shown in FIG. 1, FIG. 5, FIG. 7, FIG. 10, FIG. 13, FIG. 14, FIG. 15 and FIG. 16.

Next, an embodiment of the present invention of the re-write method will be explained with reference to FIG. 22 to FIG. 26. FIG. 22 shows an ordinary embodiment modified from embodiment shown in FIG. 1, FIG. 5, FIG. 7, FIG. 10, FIG. 13, FIG. 14, FIG. 15, FIG. 16 and this embodiment indicates a relationship between the sense amplifier circuit and memory array designated as SAMPa, SAMPb. Here, the precharge circuit is omitted to simplify the drawing. W1[1] to WL[m] indicate the word lines and a memory cell MC is connected to an intersection with the bit line in the connecting mode shown in the figure. The sensing system circuit such as the sense amplifier circuit or the like is connected in zig-zag at one end of the bit lines as shown in the figure. Although it goes without saying, the signals /SH of FIG. 10, /SH_UP and /SH_DW of FIG. 16 correspond to the RBL in FIG. 22. Moreover, the signal CSP of FIG. 10 is eliminated in FIG. 22 but such signal is represented by the CSN in FIG. 22.

Figure 23:
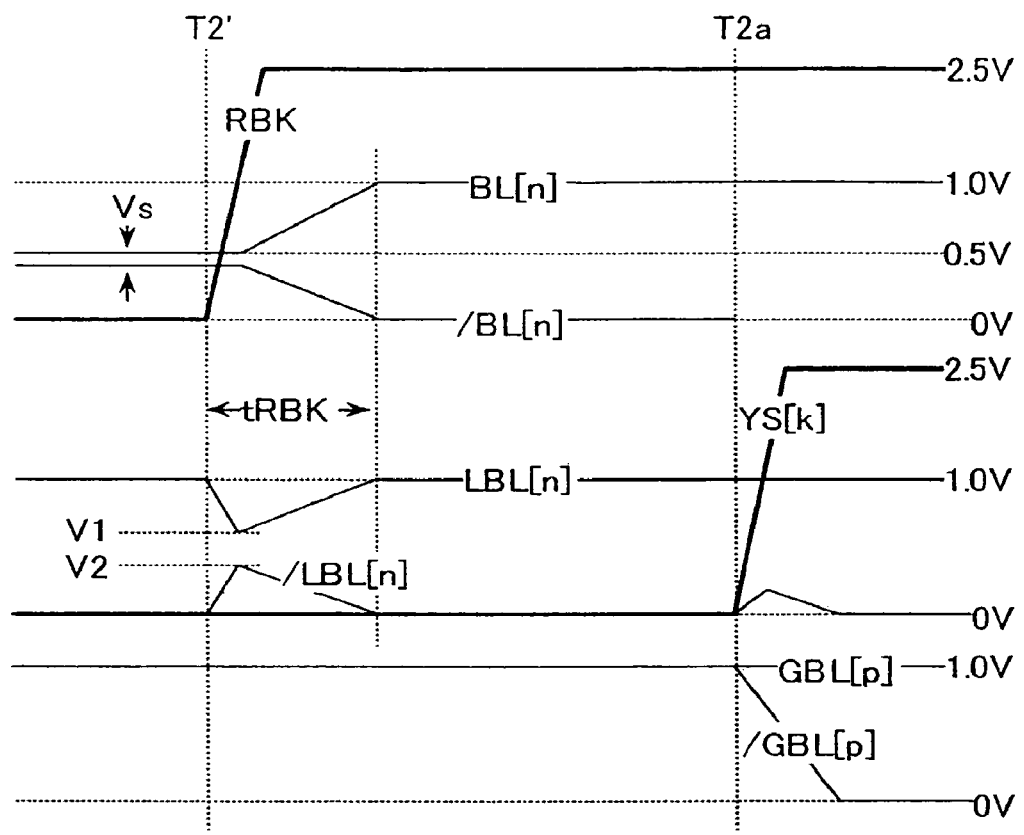
FIG. 23 is a diagram showing an embodiment of a re-write method of the present invention.

FIG. 23 is a timing chart showing the re-write operation method of FIG. 22. However, in view of avoiding the duplicated explanation, only the waveforms after a certain period has passed from assertion of the word lines and also assertion of the activate signal of the sense amplifier are shown in this figure. (Time T2' of FIG. 23 corresponds, for example, to the time T2' of FIG. 2.) Moreover, in the explanation of operations of the embodiments shown in FIG. 1, FIG. 5, FIG. 7, FIG. 10, FIG. 13, FIG. 14, FIG. 15, FIG. 16, it has been assumed that the YS[k] is already asserted when the sense amplifier is activated, but here YS[k] is asserted at the time T2*a* after the re-write operation (drive of the BL[n], /BL[n] of the sense amplifier) by the assertion of RBK at the time T2'. Since the YS[k] is asserted at the time T2*a*, the local bit lines LBL[n], /LBL[n] selected with the Y switch are connected to the global bit lines GBL[p], /GBL[p] and only one of the global bit lines GBL[p], /GBL[p] precharged to the potential VDD is driven to 0V.

In the re-write method of FIG. 23, both M206*a* and M207*a* are simultaneously turned ON with assertion of the RBK. Therefore, as shown in FIG. 23, the local bit lines LBL[n], /LBL[n] are respectively charged or discharged up to the potentials indicated as V1 and V2 with the charge sharing and thereafter are respectively charged or discharged to 1.0V and 0V with the drive by the sense amplifier. For example, as shown in FIG. 1, an input voltage of the inverter circuit (consisting of M200 and M202 in the embodiment of FIG. 1) to drive the local bit line LBL[n] in the sense amplifier circuit is set to/LBL[n] and the input voltage of the inverter circuit (consisting of M201 and M203 in the embodiment of FIG. 1) to drive the local bit line /LBL[n] is set to LBL[n]. Therefore, since the input voltage of the inverter to be driven becomes an intermediate voltage (V1, V2) as explained above, a drive current of the inverter to drive the local bit lines LBL[n], /LBL[n] is lowered and thereby the time (tRBK) required to charge or discharge the local bit lines LBL[n], /LBL[n] to 1.0V and 0V becomes longer.

Figure 24:
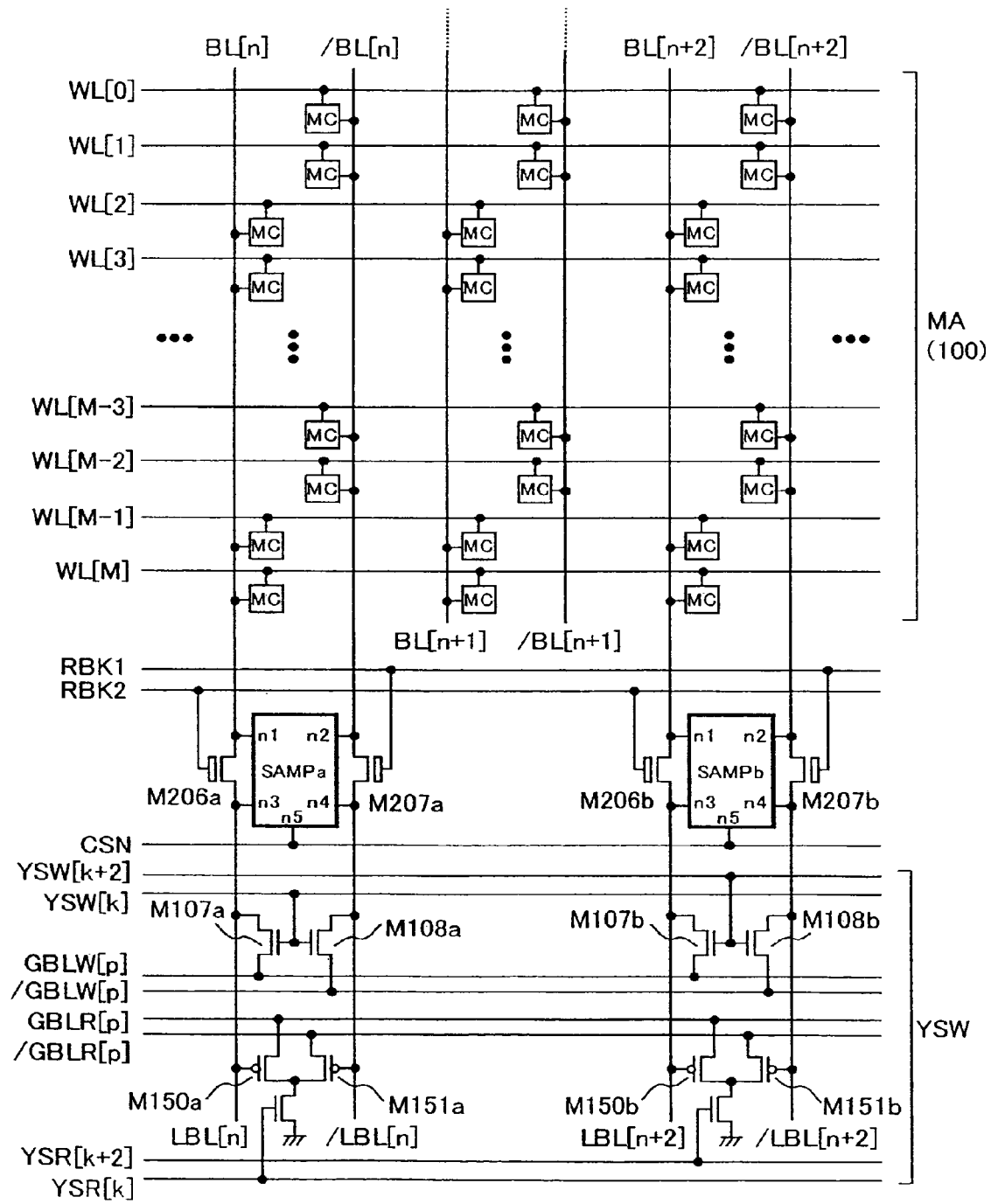
FIG. 24 is a diagram showing a circuit for realizing a re-write method of the present invention different from FIG. 22.

FIG. 24 is a diagram showing an embodiment to solve the problems explained above. Here, the precharge circuit is also omitted to simplify the drawings. In comparison with FIG. 22, the gate terminals of a pair of the MOS transistors for re-write operation connected between a pair of bit lines and a pair of local bit lines are controlled with different write back signals RBK1, RBK2. Moreover, the global bit lines are isolated to the global bit lines GBLR[p] and /GBLR[p] for read operation (the third bit line pair) and the global bit lines GBLW[p] and /GBLW[p] for write operation (the fourth bit line pair) and the global bit lines GBLR[p], /GBLR[p] for read operation are connected to the local bit lines LBL[n], /LBL[n] with the PMOS transistors indicated by M150*a*, M151*a*, M150*b*, M150*b*. On the other hand, the global bit lines GBLW[p], /GBLW[p] for write operation are connected to the local bit lines LBL[n], /LBL[n] with the NMOS transistors indicated by M107*a*, M108*a*, M107*b*, M108*b*. Although not illustrated in the drawings, the global bit lines GBLR[p], /GBLR[p] for read operation are precharged to the VDD voltage (second precharge voltage) with the precharge circuit.

A structure of the global bit lines can, of course, be used independent of the re-write method of the present invention. The effect obtained by simultaneously using these global bit lines and the re-write method of the present invention can further be improved and therefore only the embodiment when these are used simultaneously will be explained.

Figure 25:
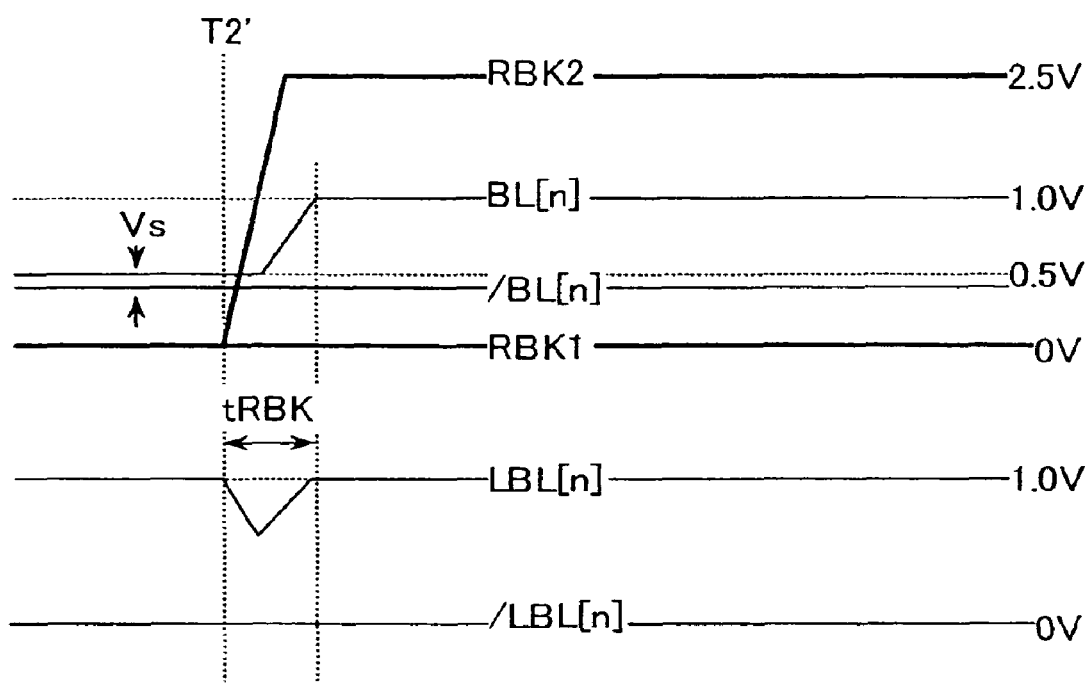
FIG. 25 is a diagram showing a re-write operation using the embodiment of FIG. 24.

FIG. 25 is a diagram showing the operation waveforms of the re-write operation method of the present invention as the embodiment of FIG. 24. Similar to FIG. 23, the waveforms after a while when the word line is asserted and then the activate signal of the sense amplifier is also asserted are shown. (The time T2' of FIG. 23 corresponds, for example, to the time T2' of FIG. 2.) In FIG. 25, only one of the two write back signals RBK1, RBK2 is asserted during the re-write operation at the time T2'. Namely, only the MOS transistor for re-write operation connected to the bit lines which are connected via the memory cell to the asserted word line among the two MOS transistors for re-write operation indicated as M206 and M207 is turned ON (M206a, M206b of FIG. 24 in the example of FIG. 25). When the word line to be asserted is determined, to which bit line among the bit line pair BL[n], /BL[n] the memory cell connected to the word line is connected is also determined uniquely. Therefore, the MOS transistor for re-write operation to be turned ON is of course determined depending an such determination. For example, in FIG. 24, when the word lines WL[2], WL[3], WL[M-1], WL[m] are asserted, it is enough that the M206a, M206b are turned ON (conductive condition) and when the word lines WL[0], WL[1], WL[M-3], WL[M-2] are asserted, it is enough that the M207a, M207b are turned ON.

Thereby, during the re-write operation, only the bit line (BL[n] in the example of FIG. 25) is connected to the corresponding local bit line (LBL[n] in the example of FIG. 25) and the complementary bit line (LBL[n] in the example of FIG. 25) is not connected to the corresponding local bit line (/LBL [n] in the example of FIG. 25). Therefore, charge sharing during the re-write operation is generated only on the bit line (BL [n] in the example of FIG. 25) and the local bit line (LBL[n] in the example of FIG. 25). Accordingly, during the re-write operation, the power source voltage or the ground potential itself is applied as an input voltage of the inverter circuit within the sense amplifier to drive the bit line (BL[n] in the example of FIG. 25) and the local bit line (LBL[n] in the example of FIG. 25).

Therefore, a drive current of the bit line (BL[n] in the example of FIG. 25) and local bit line (LBL[n] in the example of FIG. 25) during the re-write operation becomes larger than that in the method of FIG. 22 and FIG. 23. As a result, the time tRBK required for re-write operation can be shortened. Moreover, since the re-write operation time has a delay time characteristic equal to a delay time of the inverter, there rises a merit that such delay time is well matched with the delay time of the logic circuit.

Moreover, in the case where the YS[k] is asserted after the re-write operation as shown in FIG. 23, when the time tRBK required for re-write operation is shortened, the time (period up to the time T2' from the time T2a) required until the YS[k] is asserted can also be shortened. In addition, the bit lines BL[n], /BL[n] are connected with a heavier load and a large amount of power is required to charge and discharge these bit lines. Since the re-write operation can be realized only with the drive of one bit line with this system, power consumption required for charge and discharge of these bit lines can also be lowered.

Figure 26:
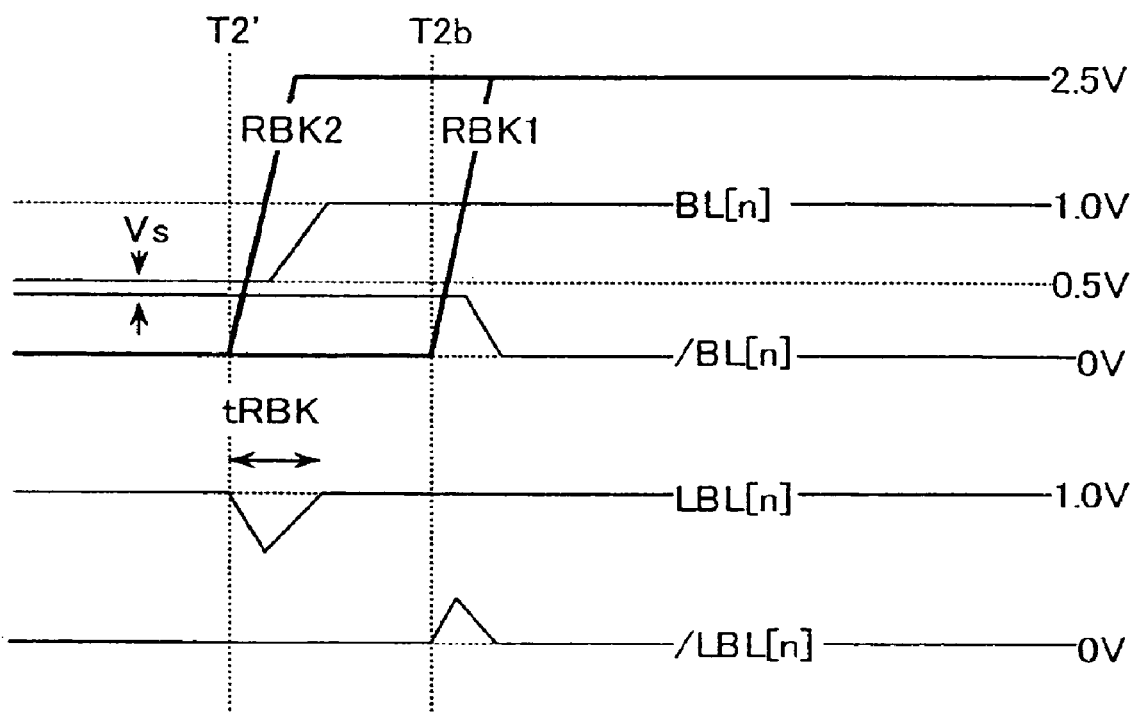
FIG. 26 is a diagram showing a re-write operation of the present invention using the embodiment of FIG. 24 different from the embodiment of FIG. 25.

FIG. 26 shows another embodiment of the re-write operation method different from that of FIG. 25. Similar to FIG. 25, the waveforms after a while from assertion of the word line and also assertion of the activate signal of the sense amplifier are illustrated. (The time T2' in FIG. 23 corresponds, for example, to the time T2' in FIG. 2.) As in the case of FIG. 25, when the re-write operation is conducted at the time T2', only one signal of the two write back signals RBK1, RBK2 is asserted. Thereafter, at the time T2b, the remaining one signal of two write back signals RBK1, RBK2 is asserted. The re-write operation is completed after tRBK of the time T2' and high speed re-write operation can be conducted as in the case of FIG. 25.

The method of the embodiment shown in FIG. 25 has a disadvantage that a load is generated in the power supply circuit to supply the potential VBM because a sum of the potential of the bit line BL[n] and a potential of the bit line /BL[n] is not equal to a potential (VBM) which is only a half of the array voltage when the bit lines BL[n], /BL[n] are precharged. Meanwhile, the method of the embodiment shown in FIG. 26 has an advantage that such problem can be eliminated because a sum of a potential of bit line BL[n] and a potential of bit line /BL[n] becomes equal to a half of the voltage (VBM) of the array voltage when the bit lines BL[n], /BL[n] are precharged. Therefore, it is recommended to select the re-write operation method of FIG. 25 and FIG. 26 depending on the capacitance of the VBM power supply and application field of the dynamic memory of the present invention.

The re-write operation method of the present invention shown in FIG. 25 and FIG. 26 is not particularly restricted in the application field only to the sensing system circuit shown in FIG. 22. For example, it is enough when the output terminal pair of the sense amplifier circuit (n3, n4 of SAMPa of FIG. 22) is connected to the bit line pair connected to the memory cell (BL[n], /BL[n] of FIG. 22) via the source and drain routes of a pair of MOS transistors (M206a, M207a of FIG. 22). Moreover, it is of course possible to apply the present invention to the sensing system circuit of an ordinary DRAM described, for example, in the [Reference 1].

Embodiment 9

In above embodiments, the address supply system is not particularly restricted. But, the embodiment of the present invention shown in FIG. 24 is used for a dynamic memory to which an address is supplied without multiplexing (the row address and column address, bank address, etc. are supplied simultaneously).

Figure 27:
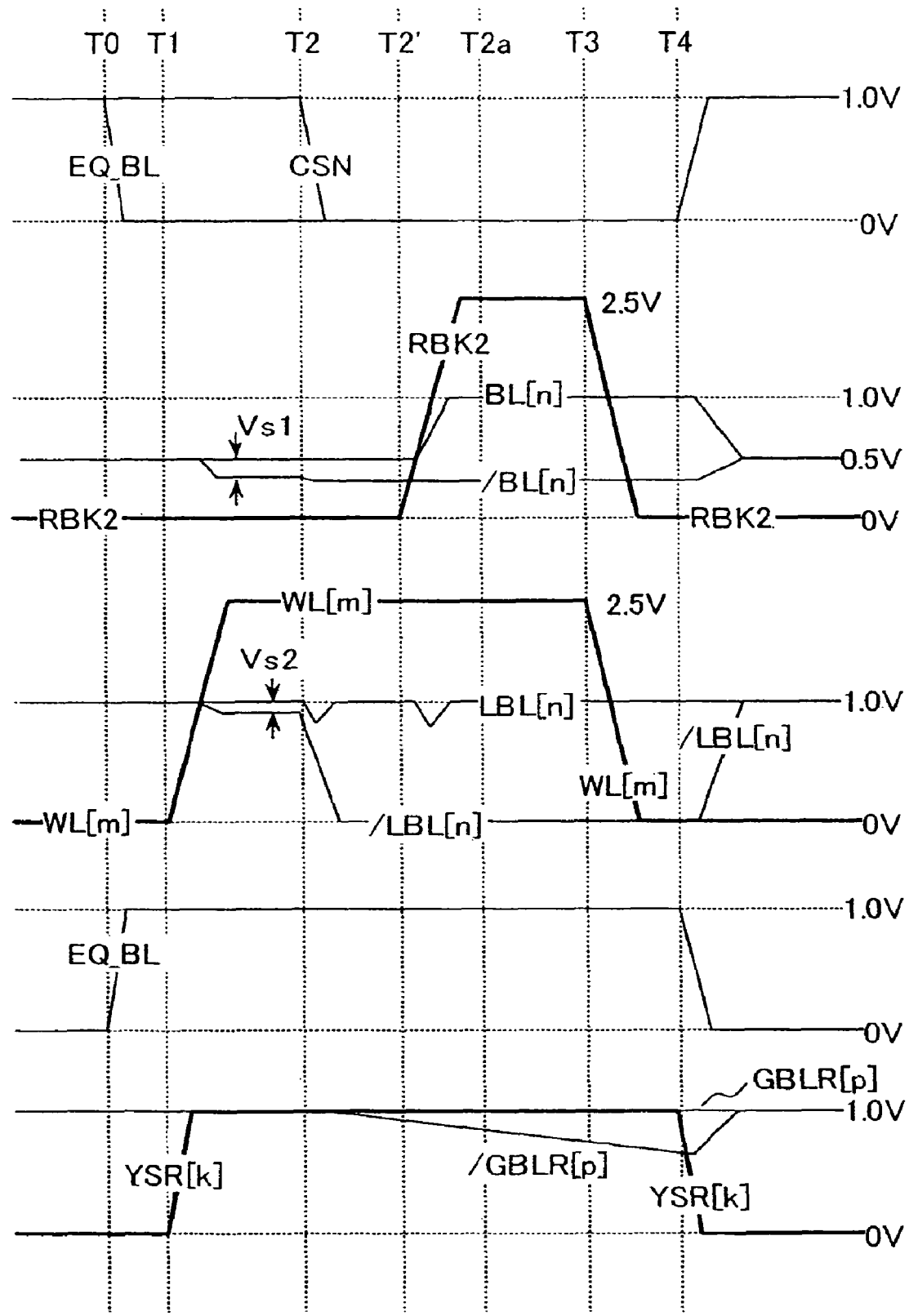
FIG. 27 is a diagram showing the read operation of the present invention using the embodiment of FIG. 24.

First, an embodiment of the timing chart of the read operation is shown in FIG. 27. Here, an operation example will be explained based on the sense amplifier circuit of FIG. 7 as an example thereof indicated as SAMPa and SAMPb of FIG. 24 in order to simplify the explanation. The part same as that of FIG. 8 is not explained here to eliminate duplication of explanation.

In FIG. 24, the global bit line is isolated to the global bit lines for read operation GBLR[P], /GBLR[p] and the global bit lines for write operation GBLW[p], /GBLW[p]. Therefore, the YS[k] is being negated during the read operation. At the time T2, the sense amplifier is activated. When the local bit lines LBL[n], /LBL[n] are driven to 1.0V and 0V, any one (M151a in the example of FIG. 27) of the PMOS transistors M150a and M151a is turned with the local bit line (/LBL[n] in the example of FIG. 27) driven to 0V. Thereby, any one (/GBLR[p] in the example of FIG. 27) of the global bit lines for read operation GBLR[p], /GBLR[p] precharged to the potential VDD is discharged. Moreover, as the re-write operation method, the method of FIG. 25 is introduced and only one of the two write back signals RBK1, RBK2 is asserted at the time T2'. Namely, only the MOS transistor for re-write operation connected to the bit lines connected to the asserted word line via the memory cell among the two MOS transistors for re-write operation indicated as M206 and M207 is turned ON. (M206a, M206b of FIG. 24 in the example of FIG. 27)

With the control method explained above, (G1) when the local bit lines LBL[n], /LBL[n] are amplified at a high speed with the precharge system of the present invention, the global bit lines GBLR[p], /GBLR[p] for the read operation are amplified continuously in any timing and accordingly the high speed read operation of memory cell information becomes possible, and (G2) since the re-write operation is completed at a high speed, the time required until the word line is asserted and is then negated can be shortened and accordingly a higher pipeline frequency can be realized when the dynamic memory using this sensing system circuit is formed as the pipeline memory.

A circuit structure connecting the local bit lines LBL[n], /LBL[n] and the global bit lines for read operation GBLr[n], /GBLr[n] is not particularly restricted to the circuit structure consisting of the PMOS transistors M150 and M151 of FIG. 24. For example, the PMOS transistors may be replaced with the NMOS transistors. However, in this case, the local bit lines LBL[n], /LBL[n] are not connected in direct to the gate terminal of the NMOS transistor, but these local bit lines LBL[n], /LBL[n] are connected to the gate terminal via the inverter circuit. In comparison with the embodiment of FIG. 24, the number of transistors increases as much as two inverters but since the threshold voltage Vth does not drop, the global bit lines GBLR[p], /GBLR[p] for read operation can be driven at the still higher speed.

Embodiment 10

Figure 28:
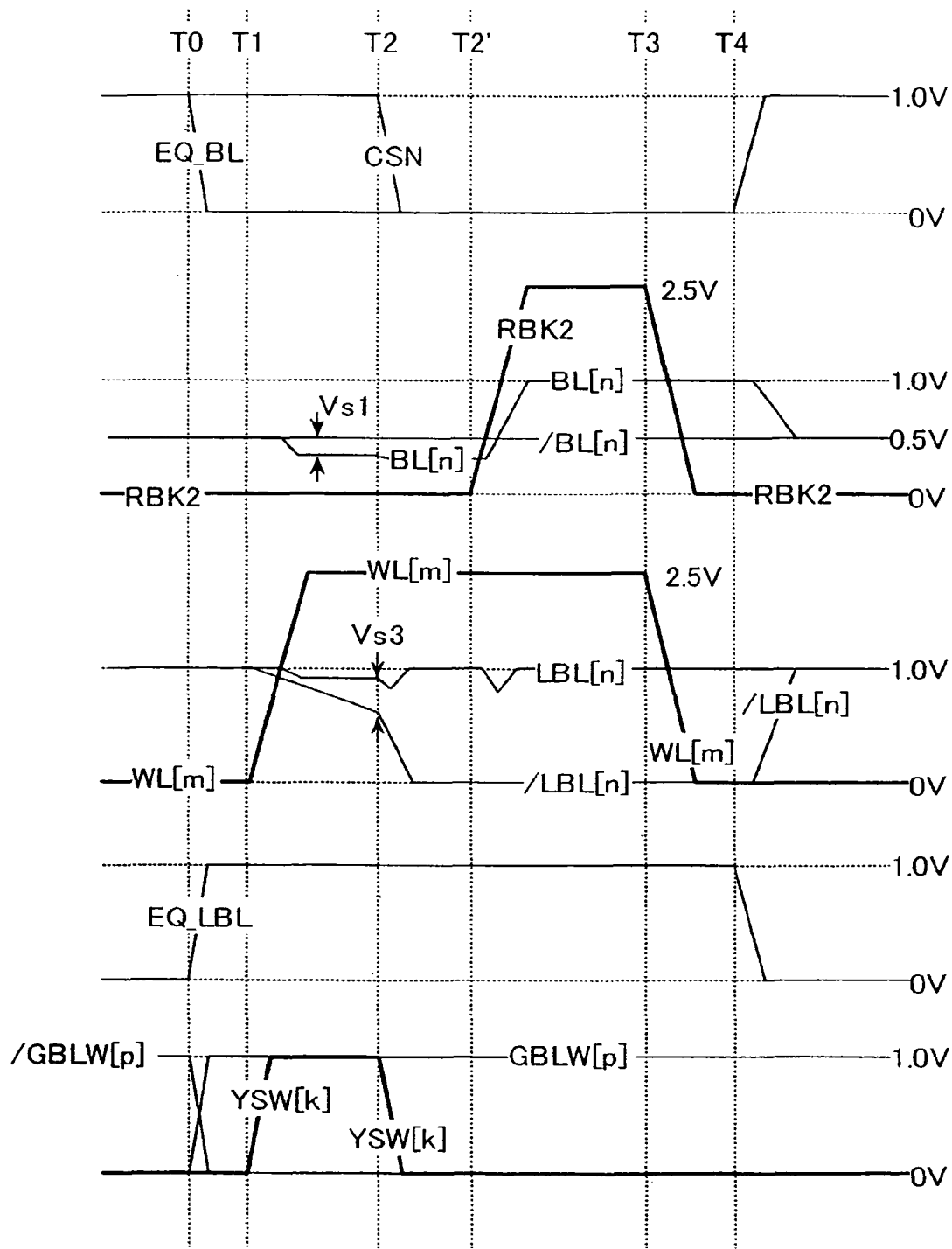
FIG. 28 is a diagram showing the write operation of the present invention using the embodiment of FIG. 24.

Next, an embodiment of the timing chart (an example of inverted write operation) of the write operation is shown in FIG. 28. Here, an operation example will be explained based on the sense amplifier circuit shown in FIG. 7 as an example this circuit indicated as SAMPa and SAMPb of FIG. 24 in order to simplify the explanation. In order to eliminate duplication of explanation, explanation of the part same as that of FIG. 8 is omitted.

Since an address is not multiplexed, a write data is supplied together with the address. Therefore, the global bit lines GBLW[p], /GBL"[p] for write operation are driven using the write data at the time T0. Thereafter, the bit line to execute the write operation is selected and the YS[k] is asserted at the time T1 in the same timing as the assertion of the word line depending on such selecting operation. This YS[k] is negated simultaneously with the activation of sense amplifier (time T2). The data corresponding to the write data appears on the local bit lines LBL[n], /LBL[n] corresponding to the bit lines for write operation and the potential difference Vs3 corresponding to the write data appears when the sense amplifier is driven (time T2). The sense amplifier circuit amplifies the potential difference Vs3 to charge and discharge the local bit lines LBL[n], /LBL[n].

Here, it is also a characteristic that the timings other than that of the YS[k] are same as the read timing. Therefore, for the bit lines not selected with assertion of the YS[k] during the read operation, the re-write operation is carried out in the same time as the read operation. Moreover, in the ordinary write system to the DRAM, the write operation is executed to the memory cell after the re-write operation resulting from the read operation. However, in the method of the present invention explained above, the write operation and re-write operation are conducted in parallel. Therefore, the period until negation from assertion of the word line can be shortened. When the dynamic memory using the sensing system circuit is formed as the pipeline memory, the pipeline frequency thereof can be increased. Moreover, in the embodiment explained above, the write data inputted to the global bit lines GBLW[p], /GBLW[p] for write operation is amplified with the sense amplifier precharged to the voltage VDD and the amplified data is written into the memory cell with the re-write method of the present invention. Therefore, it is also a characteristic that the time required for the write operation is well matched with a delay time of the logic circuit.

In the embodiment of FIG. 28, the assertion of YS[k] is conducted simultaneously with the assertion of the word line and the YS[k] is negated simultaneously with the activation timing of the sense amplifier, but the present invention is not restricted only to this timing. Timing for asserting the YS[k] is preferably set to the timing that a potential difference Vs3 is generated on the local bit lines LBL[n], /LBL[n] depending on the write data when the sense amplifier is activated. Moreover, timing for negating the YS[k] is preferably set in such a manner that any problem is not generated for the precharging of the local bit lines LBL[n], /LBL[n].

Here, it is of course possible that the sense end detection circuit shown in FIG. 17 is used for generation of the timing for assertion of the write back signal in the re-write method shown in FIG. 25 to FIG. 28.

The read and write methods using the global bit line of the present invention shown in FIG. 27 and FIG. 28 are not particularly restricted in the application thereof only to the sensing system circuit shown in FIG. 24. For example, when the sense amplifier is used by the VDD precharge system even in the sensing circuit of the ordinary DRAM described in the [Reference 1], the global bit lines are isolated to the lines for read operation and the lines for write operation. Therefore, these global bit lines can be used in the same manner and the similar effect can also be attained by adding the read amplifier circuit corresponding to the PMOS transistors M150a, M151a of FIG. 24 to the global bit lines for read operation.

Connections of the substrate potential of the MOS transistors are not obviously described in the drawings of the embodiments shown in FIG. 1 to FIG. 28, but the connecting methods are not particularly restricted. Moreover, in the embodiments shown in FIG. 1 to FIG. 28, a destructive cell which requires re-write (DRAM cell of the so-called 1T1C type formed of one transistor and one capacitor) is assumed but it is of course possible to introduce the method of the present invention, for example, to the sensing system circuit of the memory array including the non-destructive read cell consisting of three NMOS transistors. Particularly, the structure of memory cell is not restricted. In the embodiments of the present invention, the power source potential is assumed to a certain value under the condition that the bit line amplitude is 1.0V and setup voltage of the word line is 2.5V or the like for the explanation but the present invention is not of course restricted thereto.

The major effects of the present invention are as follows.

(1) By using the power source voltage of sense time, re-write time and write time respectively can be set almost to the characteristic that is same as the sense time characteristic of the VDD precharge system shown in FIG. 21. Namely, the sense time becomes further even in the low voltage operation when temperature is lower in comparison with the sense time when temperature is high and deterioration of sense rate in the low voltage operation can be maintained to the similar degree as the delay time of the CMOS inverter shown in FIG. 20(B). With this characteristic, the DRAM macro using the sensing system circuit of the present invention is provided with the characteristic well matched with the low voltage characteristic of the logic circuit. Therefore, it can no longer be concluded that any one of the logic circuit and the DRAM macro mainly controls the low voltage characteristic and thereby the DRAM macro and logic LSI can be mounted on the same substrate without considerable deterioration of the final LSI characteristic.

(2) The temperature characteristic of the DRAM macro is same as that of the logic circuit because a drive current of the sense amplifier of the present invention is mainly governed with a drift current in place of a diffusion current of the drain current of MOS transistors. In general, the diffusion current changes very sensibly for temperature and threshold voltage of MOS transistors. Therefore, when the sense amplifier is used in the region where the diffusion current governs the operation in place of the drift current like the sensing system circuit of the prior art, the sense time changes largely for fluctuation of manufacturing process of LSI and fluctuation of operation environment of LSI. This change may be developed up to a deterioration of the yield rate of the LSI circuit and as a result, manufacturing cost of the LSI using the DRAM circuit of such structure becomes high. Therefore, the sensing system circuit of the present invention has a characteristic that it is resistive to fluctuation in the manufacturing process of LSI and fluctuation in the operation environment of LSI. Moreover, the circuit of the present invention can be said to have a higher yield rate.

(3) While the characteristic of the VDD precharge system is utilized, a particular cell such as a dummy cell which has been required in the existing VDD precharge system is no longer required. Therefore, the manufacturing process and circuit can remarkably be simplified to improve the yield rate and assures low manufacturing cost of LSI.

(4) Since it can be judged that amplification of the sense amplifier is completed when only one of the local bit line pair is driven to 0V in order to detect that the amplification of the local bit line of sense amplifier is completed, a sense end detection circuit may be easily formed with a 2-input NAND gate and the read operation can be executed in any timing.

(5) The minimum value required for accurate operation of the sense amplifier for a potential difference Vs of the bit line read on the bit lines from the memory cell after the assertion of the word line can be set to a small value in comparison with a value of the existing sensing system circuit.

INDUSTRIAL FIELD OF UTILIZATION

The present invention can be used as a sense amplifier for detecting and holding the signals and particularly suitable for detection of information stored in a memory cell consisting of one MOSFET and one capacitor. The present invention can also be applied to a DRAM such as a single DRAM, DDR-SDRM and DRAM including the other circuits.

The invention claimed is:
1. A semiconductor device comprising:
a plurality of first and second word lines;
a first bit line;
a second bit line;
a third bit line;
a fourth bit line;
a plurality of first memory cells provided at intersections of said first word lines and said first bit line;
a plurality of second memory cells provided at intersections of said second word lines and said second bit line;
a first MOSFET having a source and drain path coupled to said first bit line and said third bit line;
a second MOSFET having a source and drain path coupled to said second bit line and said fourth bit line;
a sense amplifier coupled to said third and fourth bit lines;
a first control line coupled to a gate of said first MOSFET; and
a second control line coupled to a gate of said second MOSFET,
wherein when one of said plurality of first word lines is selected, said first MOSFET is in on-state and said first MOSFET is in off-state during a rewriting operation, and wherein when one of said plurality of second word lines is selected, said second MOSFET is in on-state and said first MOSFET is in off-state during said rewriting operation.

2. The semiconductor device according to claim 1,
wherein during said rewriting operation to rewrite to one of said plurality of first memory cells, said first control line is changed to an asserted level, said second control line is kept in a negated level, and said sense amplifier is used for rewriting to said one of said plurality of first memory cells which is coupled to a selected one of the plurality of first word lines,
wherein during said rewriting operation to rewrite to one of said plurality of second memory cells, said first control line is kept in negated level, said second control line is changed to an asserted level, and said sense amplifier is used for rewriting to said one of said plurality of second memory cells which is coupled to a selected one of the plurality of second word lines.

3. The semiconductor device according to claim 2, further comprising:
a first bit line pair having a fifth bit line and a sixth bit line;
a third MOSFET having a source and drain path coupled to said third bit line and said fifth bit line; and
a fourth MOSFET having a source and drain path coupled to said fourth bit line and said sixth bit line,
wherein said first and second MOSFETs each have a thicker gate insulating layer than said third and fourth MOSFETs.

4. The semiconductor device according to claim 3, wherein said first bit line pair is a global bit line pair for write operation.

5. The semiconductor device according to claim 4, further comprising:
a second bit line pair including a seventh bit line and an eighth bit line;
a fifth MOSFET having a source and drain path coupled to said third bit line and said seventh bit line; and
a sixth MOSFET having a source and drain path coupled to said fourth bit line and said eighth bit line,
wherein said second bit line pair is a global bit line pair for read operation.

6. The semiconductor device according to claim 5,
wherein after a first time period said levels of said first and second control lines are set on a same level.

7. A semiconductor device comprising:
a plurality of first and second word lines;
a first bit line;
a second bit line;
a third bit line;
a fourth bit line;
a plurality of first memory cells provided at intersections of said first word lines and said first bit line;
a plurality of second memory cells provided at intersections of said second word lines and said second bit line;
a first MOSFET having a source and drain path coupled to said first bit line and said third bit line;
a second MOSFET having a source and drain path coupled to said second bit line and said fourth bit line;
a sense amplifier coupled to said third and fourth bit lines;
a first control line coupled to a gate of said first MOSFET; and a second control line coupled to a gate of said second MOSFET, wherein when one of said plurality of first word lines is selected, said first MOSFET is set to on-state first and then said second MOSFET is set to on-state during a rewriting operation, wherein when one of said plurality of second word lines is selected, said second MOSFET is set to on-state first and then said first MOSFET is set to on-state during said rewriting operation.

8. The semiconductor device according to claim 7, further comprising:

a precharge circuit coupled to the third and fourth bit lines;

wherein said precharge circuit electrically connects said third bit line with said fourth bit line after said second MOSFET is set to on-state when one of the first word lines is selected, and wherein said precharge circuit electrically connects said third bit line with said fourth bit line after said first MOSFET is set to on-state when one of the second word lines is selected.

9. The semiconductor device according to claim 8, further comprising:

a first bit line pair having a fifth bit line and a sixth bit line;

a third MOSFET having a source and drain path coupled to said third bit line and said fifth bit line; and a fourth MOSFET having a source and drain path coupled to said fourth bit line and said sixth bit line, wherein said first and second MOSFETs each have a thicker gate insulating layer than said third and fourth MOSFETs.

10. The semiconductor device according to claim 9, wherein said first bit line pair is a global bit line pair for write operation.

11. The semiconductor device according to claim 10, further comprising:

a second bit line pair including a seventh bit line and an eighth bit line;

a fifth MOSFET having a source and drain path coupled to said third bit line and said seventh bit line; and a sixth MOSFET having a source and drain path coupled to said fourth bit line and said eighth bit line, wherein said second bit line pair is a global bit line pair for read operation.

* * * * *